United States Patent
Katou

(10) Patent No.: US 8,675,399 B2
(45) Date of Patent: Mar. 18, 2014

(54) MAGNETIC UNIT AND MAGNETIC STORAGE DEVICE

(75) Inventor: Yuukou Katou, Tokyo (JP)

(73) Assignee: NEC Corporation, Tokyo (JP)

( * ) Notice: Subject to any disclaimer, the term of this patent is extended or adjusted under 35 U.S.C. 154(b) by 470 days.

(21) Appl. No.: 12/528,393

(22) PCT Filed: Dec. 4, 2007

(86) PCT No.: PCT/JP2007/073354
§ 371 (c)(1),
(2), (4) Date: Oct. 13, 2009

(87) PCT Pub. No.: WO2008/102498
PCT Pub. Date: Aug. 28, 2008

(65) Prior Publication Data
US 2010/0110591 A1    May 6, 2010

(30) Foreign Application Priority Data

Feb. 23, 2007   (JP) ................................ 2007-044701

(51) Int. Cl.
*G11C 11/02* (2006.01)
(52) U.S. Cl.
USPC ........................................ 365/158; 365/171
(58) Field of Classification Search
USPC ................. 365/158, 173, 148, 171; 360/324;
428/811, 812, 811.1–3, 815, 819,
428/819.1–4, 824, 824.1–5, 820, 827
See application file for complete search history.

(56) References Cited

U.S. PATENT DOCUMENTS

| 6,812,537 B2 * | 11/2004 | Okazawa et al. ............ 257/421 |
| 7,184,301 B2 | 2/2007 | Sugibayashi et al. |
| 2002/0036877 A1 * | 3/2002 | Sakakima et al. ....... 360/324.11 |

(Continued)

FOREIGN PATENT DOCUMENTS

| JP | 2001267522 A | 9/2001 |
| JP | 2001284550 A | 10/2001 |

(Continued)

OTHER PUBLICATIONS

US Office Action for U.S. Appl. No. 12/602,234 issued Dec. 9, 2011.

(Continued)

*Primary Examiner* — Douglas King
(74) *Attorney, Agent, or Firm* — Sughrue Mion, PLLC

(57) ABSTRACT

A magnetic unit includes: a magnetic pinned layer, a first function body, and a second function body. The magnetic pinned layer is provided that a magnetization direction is pinned. The first function body is provided in contact with the magnetic pinned layer and performs a function with the magnetic pinned layer. The second function body is provided in contact with the magnetic pinned layer. The second function body is any of a nonmagnetic conductor, a nonmagnetic insulator, and a function body. The magnetic pinned layer includes: a plurality of magnetic substance layers, and a nonmagnetic conductive layer provided between the plurality of magnetic substance layers. The nonmagnetic conductive layer ferromagnetically or antiferromagnetically couples magnetic substance layers on both sides. A total amount of magnetizations of the plurality of magnetic substance layers is approximately zero. Among the plurality of magnetic substance layers, a magnitude of an anisotropic magnetic field of a group of magnetic substance layers directed toward a first direction is different from that of a group of magnetic substance layers directed toward a second direction.

22 Claims, 18 Drawing Sheets

(56) References Cited

U.S. PATENT DOCUMENTS

| | | |
|---|---|---|
| 2003/0185050 A1 | 10/2003 | Kishi et al. |
| 2005/0057960 A1* | 3/2005 | Saito et al. .................... 365/154 |
| 2005/0068695 A1* | 3/2005 | Djayaprawira et al. .. 360/324.11 |
| 2006/0250840 A1 | 11/2006 | Zheng et al. |
| 2007/0007610 A1* | 1/2007 | Saito et al. .................... 257/422 |
| 2007/0097742 A1* | 5/2007 | Fujiwara et al. .............. 365/171 |
| 2007/0201168 A1* | 8/2007 | Sugibayashi et al. ......... 360/324 |

FOREIGN PATENT DOCUMENTS

| | | |
|---|---|---|
| JP | 2004-193595 A | 7/2004 |
| JP | 2002-84019 A | 2/2005 |
| JP | 2005-044490 A | 2/2005 |
| JP | 2005-85951 A | 3/2005 |
| JP | 2005150303 A | 6/2005 |
| JP | 2005327988 A | 11/2005 |
| JP | 2006-60003 A | 3/2006 |
| JP | 2006-073861 A | 3/2006 |
| JP | 2006-165265 A | 6/2006 |
| JP | 2006352062 A | 12/2006 |
| WO | 2005/098953 A | 10/2005 |

OTHER PUBLICATIONS

International Search Report for PCT/JP2007/073354 mailed Mar. 4, 2008.

The Office Action for U.S. Appl. No. 12/602,234 dated Apr. 26, 2012.

* cited by examiner

MAGNETIC UNIT AND MAGNETIC STORAGE DEVICE

This application is the National Phase of PCT/JP2007/073354, filed Dec. 4, 2007, which is based upon and claims priority to Japanese Patent Application No. 2007-044701 filed on Feb. 23, 2007, and the disclosure thereof is incorporated herein by reference.

TECHNICAL FIELD

The present invention relates to a magnetic unit and a magnetic storage device, and in particular, relates to a magnetic unit and a magnetic storage device with resistance properties to high-temperature heat treatment and reduced characteristic variation.

BACKGROUND ART

A magnetic storage device using a magnetoresistive element as a storage element, a magnetic sensor, and a magnetic head for example are known as a magnetic unit.

As an example of the magnetoresistive element, a TMR structure having a tunnel insulating film provided between two magnetic substances will be described. FIG. 1 is a sectional view showing an example of a TMR element reported by Roy Scheuerlein, et al., "A 10 ns Read and Write Non-Volatile Memory Array Using a Magnetic Tunnel Junction and FET Switch in each Cell", 2000 IEEE International Solid-State Circuits Conference DIGEST OF TECHNICAL PAPERS (p. 128). This TMR element includes an antiferromagnetic layer 201, a pinned layer 202, a tunnel insulating layer 203, and a ferromagnetic free layer 204, which are laminted. The antiferromagnetic layer 201 is formed from FeMn (10 nm). The ferromagnetic pinned layer 202 is formed from CoFe (2.4 nm). The tunnel insulating layer 203 is formed from $Al_2O_3$. The ferromagnetic free layer 204 is formed from NiFe (5 nm). Conductive wiring lines are connected to the antiferromagnetic layer 201 and the free layer 204 such that voltage can be applied thereto. A magnetization direction of the pinned layer 202 is pinned to a certain direction by the antiferromagnetic layer 201. The free layer 204 is formed to easily be magnetized to a certain direction, where this magnetization direction can be changed by externally applying a magnetic field. Among lateral directions of a film of the free layer 204, a direction to which magnetization is easy is referred to as an easy axis and a direction which is perpendicular to the easy axis and to which magnetization is hard is referred to as a hard axis. When applying voltage between the free layer 204 and the pinned layer 202, an electric current flows through the tunnel insulating film 203, and a resistance value changes depending on the relationship between magnetization directions of the free layer 204 and the pinned layer 202. That is to say, the resistance is low when the magnetization directions are identical and the resistance is high when the magnetization directions are opposite to each other.

Next, a nonvolatile memory (magnetic storage device) using TMR elements as storage elements, will described. FIG. 2 is a perspective view showing an example of a nonvolatile memory reported by M. Durlam, et al., "Nonvolatile RAM based on Magnetic Tunnel Junction Elements", 2000 IEEE International Solid-State Circuits Conference DIGEST OF TECHNICAL PAPERS (p. 130). This nonvolatile memory 210 is provided with a pair of wiring lines intersecting on and under each of TMR elements 205 arranged in arrays. Upper electrodes 206 are connected to free layers of the TMR elements 205. Antiferromagnetic layers of the TMR elements 205 are connected to drains of transistors 208 provided in lower layers through third wiring lines 207. By letting the current flow through two wiring lines B (any of B1 to B4) and wiring line D (any of D1 to D4), a combined magnetic field is generated in the vicinity of an intersection and a magnetization direction of a free layer is set depending on a direction of the current. Consequently, a resistance value of the TMR element 205 can be changed. Data is read as follows. First, the transistor 208 connected to the TMR element 205 for read is turned to the on-state by a wiring line W. Next, voltage is applied from the wiring line B to the TMR element 205. Consequently, the current flows through the TMR element 205. The read is performed by evaluating the resistance value of the TMR element 205 with the flowing current.

In general, an antiferromagnetic substance used for an antiferromagnetic layer of the above-mentioned TMR element, is FeMn, IrMn, PtMn, and NiMn for example. Mn used for these materials is known to be a material which relatively moves easily at high temperature. In manufacturing processes of semiconductor devices, high-temperature treatment is often performed for the purpose of wiring lines formation and uniformity of transistor characteristics. When high-temperature treatment is performed during production of magnetic units however, Mn atoms diffuse to other magnetic substances and the like, and characteristics of magnetic units may be degraded. That is, conventional magnetic units have a problem that it is difficult to use high-temperature process.

As related art, Japanese Laid-Open Patent Application JP-P2005-85951A discloses a magnetic storage element and a magnetic memory. The magnetic storage device at least includes a storage layer which retains information depending on magnetization states of a magnetic substance, and a subsidiary magnetic substance layer of which magnetization state is changed due to external magnetic fields. The subsidiary magnetic substance layer includes a plurality of magnetic substance layers divided by nonmagnetic layers. In the subsidiary magnetic substance layer, magnetic interaction of antiparallel magnetizations is present between adjacent magnetic substance layers. The total amount of the magnetizations of the even-numbered magnetic substance layers of the subsidiary magnetic substance layer and the total amounts of the magnetizations of the odd-numbered magnetic substance layers of the subsidiary magnetic substance layer are approximately equal.

Japanese Laid-Open Patent Application JP-P2006-60003A (US2006038213) discloses a magnetic memory. The magnetic memory includes a magnetoresistive element including a free magnetic layer, a first wiring line extending in a first direction slanting with respect to an easy axis of the free magnetic layer, a second wiring line extending in a second direction perpendicular to the first direction, and a write circuit which writes data in the free magnetic layer by starting to supply a second write current to the second wiring line after starting application of a first write current to the first wiring line and before stopping the application of the first write current. The free magnetic layer includes first to N-th ferromagnetic layers (N is an integer, equal to or more than 4) and first to (N−1)-th nonmagnetic layers. The i-th nonmagnetic layer (i is any integer of 1 to N−1) among the first to (N−1)-th nonmagnetic layers is provided between the i-th ferromagnetic layer and the (i+1)-th ferromagnetic layer. The free magnetic layer is configured such that the strength of action to antiferromagnetically couple the j-th ferromagnetic layer and the (j+1)-th ferromagnetic layer (j is any integer of 2 to N−2)

is greater than the strength of action to antiferromagnetically couple the first ferromagnetic layer and the second ferromagnetic layer.

Japanese Laid-Open Patent Application JP-P2006-73861A discloses a magnetic storage device. The magnetic storage device judges storage states based on the respective magnetization directions of a pinned layer and a free layer. The magnetic storage device includes an antiferromagnetic layer, the pinned layer which is formed on the antiferromagnetic layer and of which magnetization direction is pinned, a first nonmagnetic layer formed on the pinned layer, the free layer which is formed on the first nonmagnetic layer and of which magnetization direction is changed depending on external magnetic fields, and a metal film formed on the free layer. The metal film contains ruthenium and the thickness of the free layer is between 1.5 nm and 5 nm.

Japanese Laid-Open Patent Application JP-P2006-165265A discloses a storage element and a memory. The storage element includes a storage layer for retaining information depending on magnetization states of a magnetic substance. Magnetization pinned layers are provided above and below the storage layer through intermediate layers. The respective intermediate layers include insulating layers. In the magnetization pinned layers above and below the storage layer, the magnetization directions of the respective ferromagnetic layers nearest to the storage layer are opposite to each other. By flowing the current in a lamination direction, the magnetization direction of the storage layer is changed and information is recorded for the storage layer. Sheet resistance values of the two intermediate layers over and under the storage layer are different from each other.

DISCLOSURE OF INVENTION

An object of the present invention is to provide a magnetic unit and a magnetic storage device which can prevent characteristic degradation caused by material diffusion even when high-temperature treatment is performed and which have small characteristic variation.

In order to solve the above-mentioned problems, a first magnetic unit of the present invention includes a magnetic pinned layer, a first function body, and a second function body. A magnetization direction of the magnetic pinned layer is pinned. The first function body, which is provided in contact with a first side of the magnetic pinned layer, performs a function with the magnetic pinned layer. The second function body is provided in contact with a second side opposite to the first side of the magnetic pinned layer. The second function body is any of a nonmagnetic conductor, a nonmagnetic insulator, and a function body which performs a function with the magnetic pinned layer. The magnetic pinned layer includes a plurality of magnetic substance layers and at least one nonmagnetic conductive layer provided between the plurality of magnetic substance layers. The nonmagnetic conductive layer ferromagnetically or antiferromagnetically couples magnetic substance layers on both sides. At least one nonmagnetic conductive layer antiferromagnetically couples magnetic substance layers on both sides. The total amount of the magnetizations of the plurality of magnetic substance layers is approximately zero. Among the plurality of magnetic substance layers, the magnitude of an anisotropic magnetic field of a group of magnetic substance layers directed toward a first direction and the magnitude of an anisotropic magnetic field of a group of magnetic substance layers directed toward a second direction opposite to the first direction are different from each other.

In order to solve the above-mentioned problem, a first magnetic storage device of the present invention includes a plurality of word lines, a plurality of bit lines, and a plurality of magnetic units. The plurality of word lines extends in a first direction (X). The plurality of bit lines extends in a second direction (Y). The plurality of magnetic units is provided to correspond to the intersections of the plurality of word lines and the plurality of bit lines, and one end of the magnetic unit is connected to corresponding one of the word line and the bit line. The magnetic unit includes a magnetic pinned layer, a first function body, and a second function body. A magnetization direction of the magnetic pinned layer is pinned. The first function body, which is provided in contact with a first side of the magnetic pinned layer, performs a function with the magnetic pinned layer. The second function body is provided in contact with a second side opposite to the first side of the magnetic pinned layer. The second function body is any of a nonmagnetic conductor, a nonmagnetic insulator, and a function body which performs a function with the magnetic pinned layer. The magnetic pinned layer includes a plurality of magnetic substance layers and at least one nonmagnetic conductive layer provided between the plurality of magnetic substance layers. The nonmagnetic conductive layer ferromagnetically or antiferromagnetically couples magnetic substance layers on both sides. At least one nonmagnetic conductive layer antiferromagnetically couples magnetic substance layers on both sides. The total amount of the magnetizations of the plurality of magnetic substance layers is approximately zero. Among the plurality of magnetic substance layers, the magnitude of an anisotropic magnetic field of a group of magnetic substance layers directed toward a first direction is different from the magnitude of an anisotropic magnetic field of a group of magnetic substance layers directed toward a second direction opposite to the first direction.

BRIEF DESCRIPTION OF THE DRAWINGS

The above and other objects and features of the present invention will be more apparent from the following description of certain preferred exemplary embodiments taken in conjunction with the accompanying drawings, in which.

BEST MODE FOR CARRYING OUT THE INVENTION

Exemplary embodiments of a magnetic unit and a magnetic storage device of the present invention will be described below with reference to the attached drawings.

First Exemplary Embodiment

Figure 1:
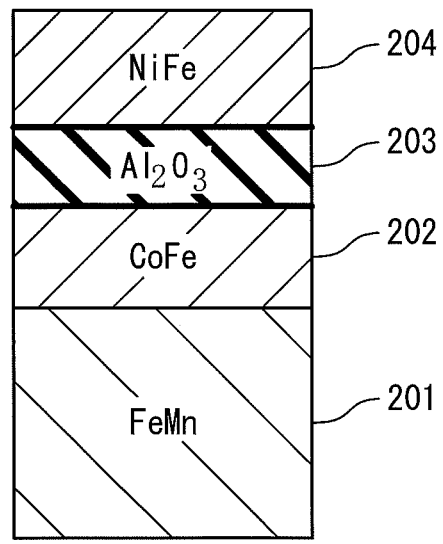
FIG. 1 is a sectional view showing an example of a TMR element according to the background art.
Figure 2:
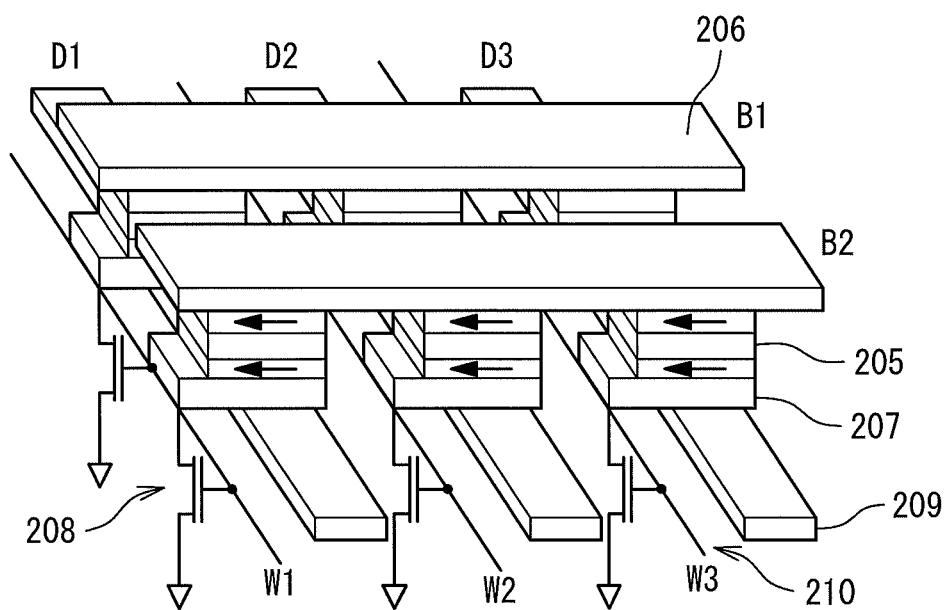
FIG. 2 is a perspective view showing an example of a nonvolatile memory according to the background art.
Figure 3:
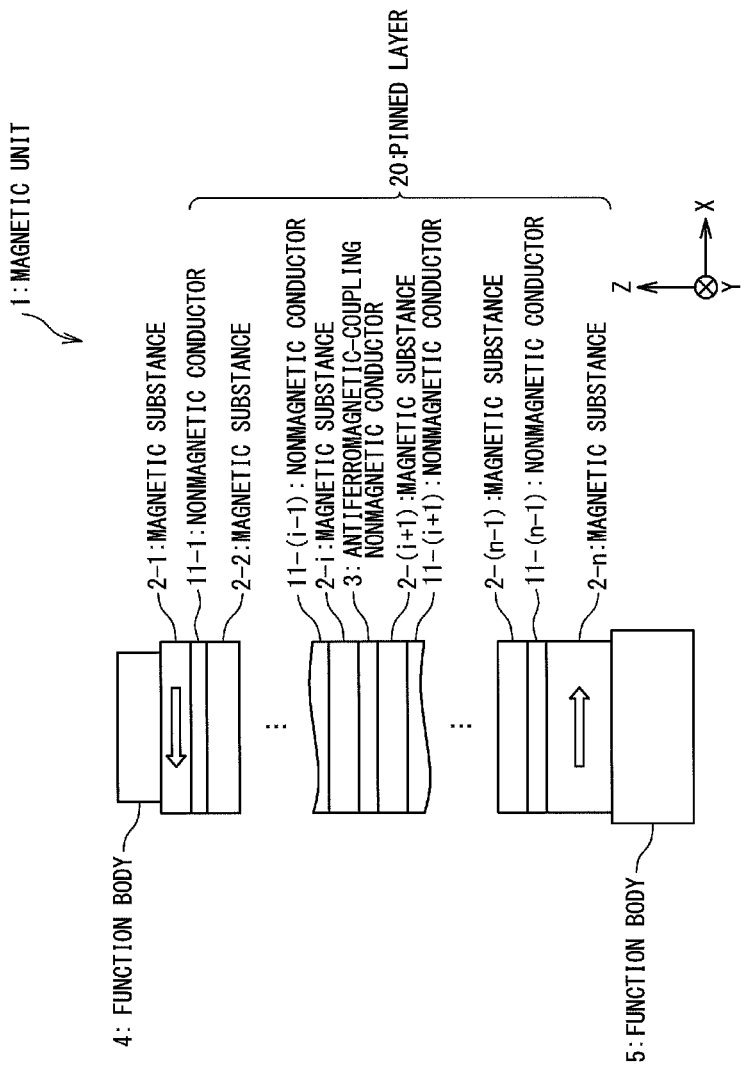
FIG. 3 is a sectional view showing a configuration of a primary part of a magnetic unit according to an exemplary embodiment of the present invention.
Figure 4:
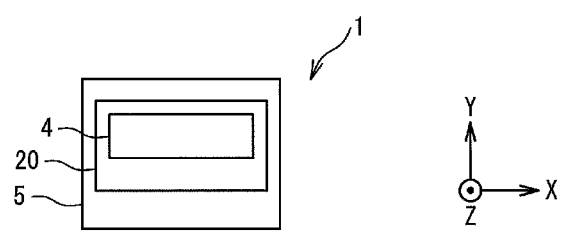
FIG. 4 is a plan view showing the configuration of the primary part of the magnetic unit according to the exemplary embodiment of the present invention.

A magnetic unit and a magnetic storage device according to the first exemplary embodiment of the present invention will be described with reference to the attached drawings. FIG. 3 is a sectional view showing a configuration of a primary part of the magnetic unit according to the first exemplary embodiment of the present invention. FIG. 4 is a plan view showing the configuration of the primary part of the magnetic unit according to the first exemplary embodiment of the present invention. An arrow in each layer in FIG. 3 shows a direction of magnetization in the layer. The same applies to sectional views of magnetic units described below.

As shown in FIG. 3, a magnetic unit 1 includes a function body 4, a pinned layer 20, and a function body 5.

The function body 4, which is provided in contact with one side of the pinned layer 20, is a nonmagnetic conductor, a nonmagnetic insulator, or a monolayer or multilayer film having a predetermined function. The predetermined function is achieved together with the whole pinned layer 20 or part thereof. The function body 5, which is provided in contact with the other side of the pinned layer 20, is a nonmagnetic conductor, a nonmagnetic insulator, or a monolayer or multilayer film having a predetermined function. The predetermined function is achieved together with the whole pinned layer 20 or part thereof.

The pinned layer 20 includes a plurality of magnetic substances 2 and an antiferromagnetic-coupling nonmagnetic conductor 3, and may include a plurality of nonmagnetic conductors 11. The plurality of magnetic substances 2 is the layered magnetic substances 2-1 to 2-$n$ ($n \geq 2$, a natural number). In the pinned layer 20, the magnetic substance 2-1 is provided on the side in contact with the function body 4, while the magnetic substance 2-$n$ is provided on the side in contact with the function body 5.

The plurality of nonmagnetic conductors 11 is the layered nonmagnetic conductors 11-1 to 11-($n-1$). The i-th nonmagnetic conductor 11-$i$ ($i=1$ to ($n-1$)) is provided between the i-th magnetic substance 2-$i$ and the ($i+1$)-th magnetic substance 2-($i+1$). The nonmagnetic conductor 11-$i$ ferromagnetically or antiferromagnetically couples the magnetic substance 2-$i$ and the magnetic substance 2-($i+1$) on respective sides.

The antiferromagnetic-coupling nonmagnetic conductor 3 is provided between the i-th magnetic substance 2-$i$ ($i=1$ to ($n-1$)) and the ($i+1$)-th magnetic substance 2-($i+1$), between the magnetic substance 2-1 and the magnetic substance 2-$n$. The antiferromagnetic-coupling nonmagnetic conductor 3 is provided in the position of the i-th nonmagnetic conductor 11-$i$ instead of the nonmagnetic conductor 11-$i$. That is to say, at least one nonmagnetic conductor 11 is the antiferromagnetic-coupling nonmagnetic conductor 3. The antiferromagnetic-coupling nonmagnetic conductor 3 is provided in any position. The antiferromagnetic-coupling nonmagnetic conductor 3 antiferromagnetically couples the magnetic substance 2-$i$ and the magnetic substance 2-($i+1$) on respective sides.

In the case of n=2 however, i.e. when the number of the magnetic substances 2 is two (2-1 and 2-2), the antiferromagnetic-coupling nonmagnetic conductor 3 is provided first between the magnetic substance 2-1 and the magnetic substance 2-2 in priority to the nonmagnetic conductor 11. In the case of n>2, i.e. when the number of the magnetic substance layers 2 is three and above, where the number of spaces between the magnetic substance layers is two and above, the antiferromagnetic-coupling nonmagnetic conductor 3 is provided in one space and the nonmagnetic conductors 11 are provided in the other spaces.

That is to say, in the magnetic unit 1, the magnetic substance 2-1 is formed in contact with the function body 4 and then the nonmagnetic conductors 11 and the magnetic substances 2 are alternately formed. The number of times of repetitions is one and above ($n \geq 2$). The function body 5, which is in contact with the last magnetic substance 2-$n$ and performs a desired function with the magnetic substances 2, is formed.

The magnetization directions of the magnetic substances 2-1 to 2-n are pinned before use of the magnetic unit and a change in the magnetization directions is small during function operation, where the magnetization directions are not switched into the opposite directions. Since the magnetic substances 2-1 to 2-n are ferromagnetically or antiferromagnetically coupled, the magnetization direction of the magnetic substance 2-1 is pinned in the opposite direction from or the same direction as the magnetization direction of the magnetic substance 2-n. Additionally, among the magnetic substances 2 included in the magnetic substances 2-1 to 2-n, the total amount of the magnetizations of the layers magnetized in the same direction as the magnetic substance 2-1 is approximately equal to the total amount of the magnetizations of the layers magnetized in the opposite direction from the magnetic substance 2-1. Among the magnetic substances 2 included in the magnetic substances 2-1 to 2-n, an anisotropic magnetic fielder the whole layers magnetized in the same direction as the magnetic substance 2-1 is different from an anisotropic magnetic field of the whole layers magnetized in the opposite direction from the magnetic substance 2-1.

In at least the pinned layer 20 of the magnetic unit, a pattern shape of at least one magnetic substance 2-s ($1 \leq s \leq n$, where s is a natural number) has an aspect ratio of more than 1. Here, the aspect ratio means a ratio of a length of a longitudinal direction (e.g. X direction) to a length of a lateral direction (e.g. Y direction) of the pattern shape when looking the magnetic unit from above (Z direction). With such a shape, the magnetic substance 2-s has a (magnetization) easy axis which shows a directional axis to which magnetization is easy, due to shape anisotropy. In this case, the easy axis is parallel to a lengthwise direction. Consequently, the magnetization of the magnetic substance 2-s tends to be directed toward the direction of the easy axis. Therefore, the magnetization of the other ferromagnetically-coupled or antiferromagnetically-coupled magnetic substances 2 laminated on the magnetic substance 2-s tends to be directed toward a direction parallel to the easy axis. As a result, the magnetization of the whole pinned layer 20 can more easily be pinned in the direction parallel to the direction of the easy axis. It is preferable that the number of the magnetic substances 2-s mentioned here is greater. This is because a magnetization direction can be pinned more easily.

Next, an operation of the magnetic unit according to the first exemplary embodiment of the present invention (an operation method of the magnetic unit) will be described.

The magnetic unit includes magnetic substances which are long in one direction. For this reason, a (magnetization) easy axis which shows a directional axis to which magnetization is easy, is formed due to shape anisotropy. The magnetic unit undergoes processing in which the magnetic unit is exposed to a magnetic field containing components of an easy axis direction of the magnetic substance 2-1 during manufacturing or before use. Due to the magnetic field applied in the processing, the magnetization direction of the magnetic substances 2-1 to 2-n comes close to the direction of the applied magnetic field. At this time, among the magnetic substances 2 included in the magnetic substances 2-1 to 2-n, the anisotropic magnetic field of the whole layers magnetized in the same direction as the magnetic substance 2-1 is different from the anisotropic magnetic field of the whole layers magnetized in the opposite direction from the magnetic substance 2-1. Therefore, the magnetization direction of the group of magnetic substances with the greater anisotropic magnetic field is settled on a side closer to the direction of the applied magnetic field among the directions of the easy axis. On the other hand, the magnetization direction of the group of magnetic substances with the smaller anisotropic magnetic field is opposite from the former settled direction. In this way, the magnetization directions of the magnetic substances 2 can be set in desired directions. With the magnetic substances 2 of which magnetization directions are set and the function body 4, desired functions are performed.

In the magnetic unit according to the first exemplary embodiment of the present invention, the minimum configuration of the pinned layer 20 has the magnetic substance 2-1, the antiferromagnetic-coupling nonmagnetic conductor 3, and the magnetic substance 2-2. At this time, the nonmagnetic conductor 11 is not used. At least one magnetic substance 2 included in the magnetic substance 2-1 to the magnetic substance 2-n may have a shape that is long along approximately the same direction as the magnetization direction of the magnetic substance 2-1. Additionally, providing the thin magnetic substance 2-n and a small magnetization amount makes it possible to reduce a leakage field affected to the function body 5 and reduce effect on the characteristics of the function body 5. Therefore, it is preferable that the thickness of the magnetic substance 2-n is thinner than that of the magnetic substance 2-1 and that the magnetization amount of the magnetic substance 2-n is smaller than that of the magnetic substance 2-1. Additionally, the magnetic substances 2 to be used may be different materials from each other and the respective magnetic substances 2 may be laminated structures of a plurality of magnetic materials.

In the present exemplary embodiment, the magnetic substances 2 magnetized in a uniform direction can be obtained in the same way as a case where a conventional device in which an antiferromagnetic substance, a magnetic pinned layer, and a function body are laminated, obtains the magnetic pinned layer magnetized in a uniform direction due to the magnetic coupling between the antiferromagnetic substance and magnetic substances of the magnetic pinned layer. At this time, no antiferromagnetic substance is used in the present exemplary embodiment, different from the conventional case. For this reason, diffusion of antiferromagnetic materials to other magnetic substances and function bodies due to high-temperature treatment during a process, does not occur. As a result, degradation of characteristics is small and increase in characteristic variation can be prevented.

Next, the magnetic unit and the magnetic storage device according to the first exemplary embodiment of the present invention will be described in detail.

Figure 5:
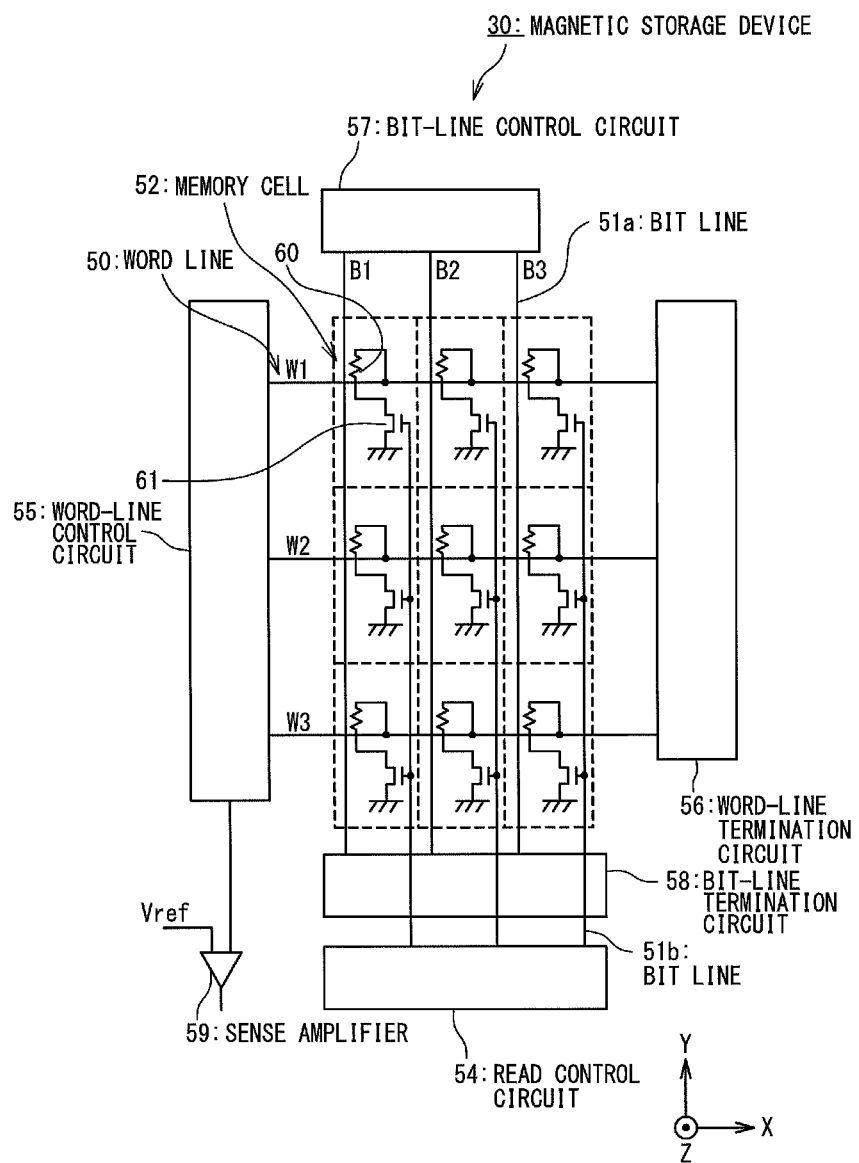
FIG. 5 is a schematic circuit block diagram showing a configuration of a magnetic storage device to which the magnetic unit is applied according to the first exemplary embodiment of the present invention.
Figure 6:
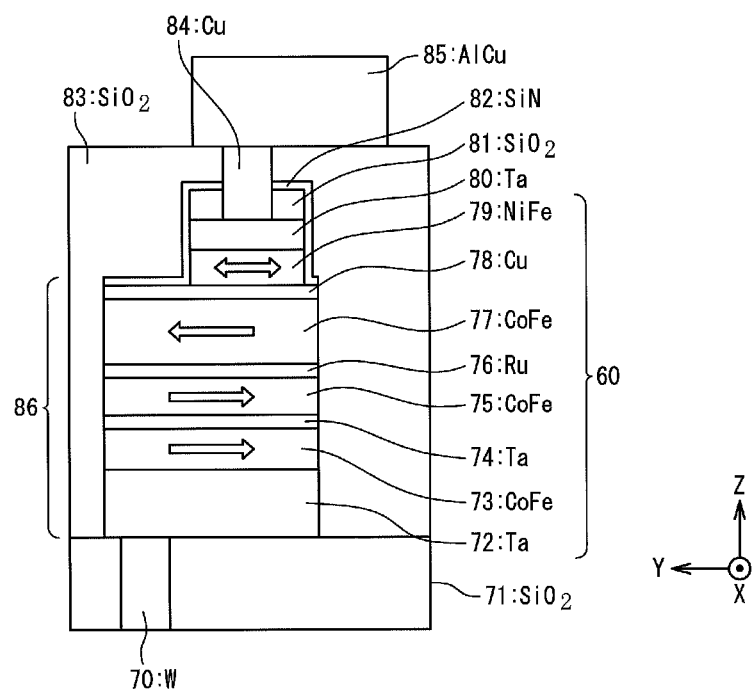
FIG. 6 is a sectional view showing a configuration of a primary part of a magnetoresistive storage element as the magnetic unit according to the first exemplary embodiment of the present invention.
Figure 7:
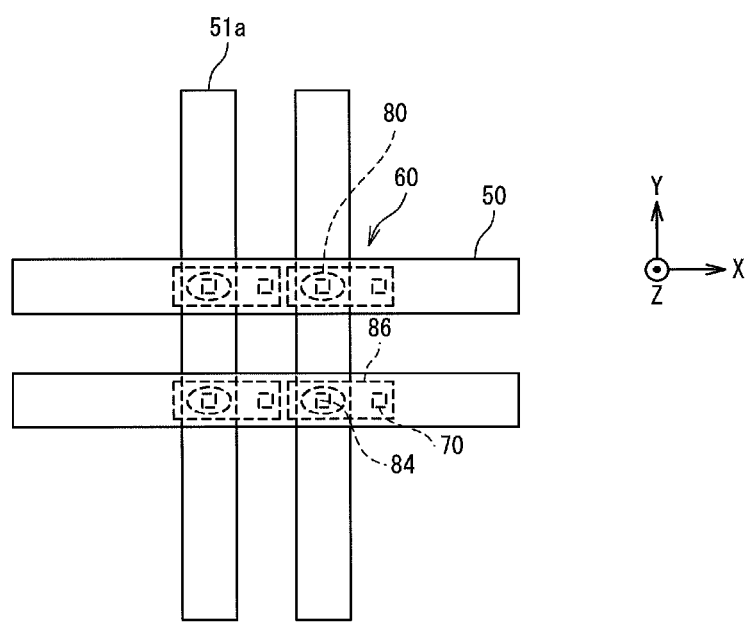
FIG. 7 is a plan view showing a configuration of a main part of a memory array of the magnetic storage device to which the magnetic unit is applied according to the first exemplary embodiment of the present invention.

FIG. 5 is a schematic circuit block diagram showing a configuration of the magnetic storage device to which the magnetic unit is applied according to the first exemplary embodiment of the present invention. FIG. 6 is a sectional view showing a primary part of a configuration of a magnetoresistive storage element as the magnetic unit according to the first exemplary embodiment of the present invention. FIG. 7 is a plan view of a main part of a memory array of the magnetic storage device to which the magnetic unit is applied according to the first exemplary embodiment of the present invention.

First, a circuit configuration will be described with reference to FIG. 5. A magnetic storage device 30 is a magnetic random-access memory. The magnetic storage device 30 includes a plurality of word lines 50, a plurality of bit lines 51a, a plurality of bit lines 51b, a plurality of memory cells 52, a read control circuit 54, a word-line control circuit 55, a word-line termination circuit 56, a bit-line control circuit 57, a bit-line termination circuit 58, and a sense amplifier 59.

The plurality of word lines 50 extends in an X direction (first direction). One end and the other end of each word line 50 are connected to the word-line control circuit 55 and the word-line termination circuit 56, respectively. The plurality of bit lines 51a extends in a Y direction (second direction perpendicular to the first direction). One end and the other end of each bit line 51a are connected to the bit-line control circuit 57 and the bit-line termination circuit 58, respectively. The plurality of bit lines 51b extends in the Y direction (second direction perpendicular to the first direction). One end and the other end of each bit line 51b are connected to a gate of a selected transistor 61 of the memory cell 52 and the read control circuit 54, respectively. Each bit line 51b is shared by the memory cells 52 (selected transistors 61) arranged along the extension direction (Y direction).

The plurality of memory cells 52 is provided to correspond to the intersections of the plurality of word lines 50 and the plurality of bit lines 51a. Each memory cell 52 includes a magnetoresistive storage element 60 and the selected transistor 61. Here, the magnetoresistive storage element 60 is a GMR (Giant Magneto Resistive) element. The magnetoresistive storage element 60 has two terminals. One terminal is connected to the word line 50 and the other terminal is connected to the source of the selected transistor 61. The drain of the selected transistor 61 is grounded and the gate is connected to the read control circuit 54 through the bit line 51b.

The read control circuit 54 selects a selected bit line 51b from the plurality of bit lines 51b at the time of read operation. The word-line control circuit 55 selects a selected word line 50 from the plurality of word lines 50. The word-line termination circuit 56 terminates the plurality of word lines 50 at the time of write operation. The bit-line control circuit 57 selects a selected bit line 51a from the plurality of bit lines 51a at the time of write operation. The bit-line termination circuit 58 terminates the plurality of bit lines 51a at the time of write operation. The sense amplifier 59, which is connected to the word-line control circuit 55, compares a reference potential Vref with a word-line potential acquired through the word-line control circuit 55 to perform data judgment at the time of read operation.

Next, a configuration of the magnetoresistive storage element 60 will be described with reference to FIG. 6.

The magnetoresistive storage element 60, which is a GMR element, includes a Ta film 72 as a lower electrode, a CoFe film 73 as the magnetic substance 2, a Ta film 74 as the nonmagnetic conductor 11, a CoFe film 75 as the magnetic substance 2, a Ru film 76 as the antiferromagnetic coupling nonmagnetic conductor 3, a CoFe film 77 as the magnetic substance 2, a Cu film 78 as a spacer layer, a NiFe film 79 as a free layer, and a Ta film 80 as an upper electrode. Here, the Ta film 72 corresponds to the function body 5. The CoFe film 73, the Ta film 74, the CoFe film 75, the Ru film 76, and the CoFe film 77 correspond to the pinned layer 20. The Cu film 78, the NiFe film 79, and the Ta film 80 correspond to the function body 4.

The Ta film 72 as a lower electrode is connected to a semiconductor substrate (not shown) to which transistors including the selected transistor 61 and wiring lines including the bit lines 51a and 51b are provided, through a W via 70. The Ta film 80 as an upper electrode is connected to an AlCu wiring line 85 as the word line 50 through a Cu via 84. The lower structure (the CoFe film 73, the Ta film 74, the CoFe film 75, the Ru film 76, the CoFe film 77, and the Cu film 78) of the magnetoresistive storage element 60 is also referred to as a BASE 86.

Next, a manufacturing method of the magnetoresistive storage element 60 will be described with reference to FIG. 6.

First, a $SiO_2$ film 71 as an interlayer insulating film is formed with the film thickness of 300 nm on the semiconductor substrate (not shown) provided with transistors including the selected transistor 61 and wiring lines including the bit lines 51a and 51b. The W via 70 is formed in a predetermined position in the $SiO_2$ film 71. After that, the Ta film 72 with the film thickness of 20 nm, a Ta film with the film thickness of 8 nm (not shown), the CoFe film 73 with the film thickness of 2 nm, the Ta film 74 with the film thickness of 0.4 nm, the CoFe film 75 with the film thickness of 1 nm, the Ru film 76 with the film thickness of 0.8 nm, the CoFe film 77 with the film thickness of 2 nm, the Cu film 78 with the film thickness of 2.5 nm, the NiFe film 79 with the film thickness of 4 nm, the Ta film 80 with the film thickness of 30 nm, and a $SiO_2$ film 81 with the film thickness of 70 nm are formed using the sputtering method.

Here, in the CoFe film 73, which is the lowermost layer of the pinned layer 20, a portion of approximately 1 nm from the interface does not work as a magnetic substance due to the reaction between the Ta film 72 and the CoFe film 73. The Ta film 74 has a thickness with which the CoFe film 73 and the CoFe film 75 are ferromagnetically coupled, and the Ru film 76 has a thickness with which the CoFe film 75 and the CoFe film 77 are antiferromagnetically coupled. Consequently, the CoFe films 73 and 75 and the CoFe film 77 are magnetized in the opposite directions from each other and the magnetization amounts of the both become equal, causing almost no leakage field to the outside.

Next, resist is formed to the GMR shape by using photolithographic technique, the $SiO_2$ film 81 without being covered with the resist is processed by using RIE (Reactive Ton Etching) technique, and then, the resist is removed by using the ashing technique. Next, the Ta film 80 and the NiFe film 79 are removed by using the milling technique using the pattern of the $SiO_2$ film 81 as a mask. After that, a SiN film 82 as a protective film is formed on the whole surface, resist is form to the shape of the BASE 86, and then, the SiN film 82, the Cu film 78, the CoFe film 77, the Ru film 76, the CoFe film 75, the Ru film 74, the CoFe film 73, and the Ta film 72 are processed.

With the manufacturing process mentioned above, the magnetoresistive storage element 60 can be formed.

As shown in FIG. 7, the BASE 86, which includes the configuration as the pinned layer 20 of the CoFe film 77/Ru film 76/CoFe film 75/Ta film 74/CoFe film 73, is a rectangle that is long in the extension direction of the word lines 50 (X direction). The NiFe film 79 as a free layer, which is formed on the BASE 86, is an ellipse that is long in the extension direction of the word lines 50 (X direction). Note that in FIG. 7, the selected transistors 61 and the bit lines 51b are not shown.

After that, the $SiO_2$ film 83 as an interlayer insulating film is formed to the whole surface by using the plasma CVD method. The whole surface is planarized thereafter by using CMP (Chemical Mechanical Polishing) technique. After that, a via hole penetrating the $SiO_2$ film 83, the SiN film 82, and $SiO_2$ film 81 on the free layer (NiFe film 79) is formed by using the photolithographic technique and dry etching technique, to form the Cu Via 84. A Ti film (30 nm), an AlCu film (500 nm), and a TiN film (30 nm) are laminated thereafter, which are processed by using the photolithographic technique and the dry etching technique to form the AlCu wiring lines 85 as the word lines 50.

Next, a magnetic field of approximately 1000 to 10000 Oe is applied to a direction of a long side of the pattern of the BASE 86. Consequently, the magnetization direction of the three CoFe film 77, CoFe film 75, CoFe film 73 of the pinned layer 20 is directed toward a direction along the magnetic field. When the magnetic field is turned back to zero, the magnetization directions of the CoFe film 77 and the CoFe films 75 and 73, which are antiferromagnetically coupled, become opposite to each other. The pinned layer 20, which is a rectangle, has an easy axis formed in a direction of a long side, due to shape anisotropy. Although the CoFe film 77 and the CoFe films 75 and 73 have equal magnetization amounts, the CoFe films 75 and 73, which are divided in two, have a smaller anisotropic magnetic field. Therefore, the CoFe film 77 is stable when being directed toward a directional axis of a long side nearer to a direction of an applied magnetic field, and the CoFe films 75 and 73 are stable when being directed toward the opposite direction. Consequently, the magnetization direction of the pinned layer 20 can be set to a desired direction.

Next, an operation method of the magnetoresistive storage element 60 will be described with reference to FIG. 5. First, a write method will be described.

The bit-line control circuit 57 selects a selected bit line 51a from the plurality of bit lines 51a. The word-line control circuit 55 selects a selected word line 50 from the plurality of word lines 50. By the current flowing through the selected bit line 51a and the selected word line 50, a combined magnetic field can be applied to the magnetoresistive storage element 60 of the memory cell 52 (selected cell) at a position where the selected bit line 51a and the selected word line 50 intersect. A magnetization switching current of the magnetoresistive storage element 60 varies depending on the magnitude of the magnetic field of the word line 50. For this reason, the magnetization is not switched in a cell where the current of the word line 50 does not flow, while in a cell where the current of the word line 50 flows, data can be written in only one cell by further setting the current of the bit line 51a so as to cause magnetization switching. A magnetization direction can be set with a direction of the current of the bit line 51a. Since a magnetic field is also applied to the pinned layer 20 at this time, material, shape, and strength of magnetic coupling of the pinned layer 20 are set so as not to cause switching at a write magnetic field.

Next, a read method will be described.

The read control circuit 54 selects a selected bit line 51b from the plurality of bit lines 51b. As a result, the selected transistor 61 of the memory cell 52 (selected cell) for read is turned to the on-state. The word-line control circuit 55 selects a selected word line 50 from the plurality of word lines 50. At this time, the word-line termination circuit 56 is turned to the open state. When voltage is applied to the selected word line 50 by the word-line control circuit 55, a read current flows through a path from the selected word line 50, the magnetoresistive storage element 60, the selected transistor 61, to the ground. The magnitude of the read current varies depending on a resistance value (a value of stored data) of the magnetoresistive storage element 60 of the memory cell 52 for read. The word-line control circuit 55 converts a current value of the read current to a voltage and outputs the voltage to the sense amplifier 59 as a sense voltage Vs. To the sense amplifier 59, an intermediate value of voltages (V0 and V1) outputted depending on data values ("0" and "1") is given as Vref. The sense amplifier 59 judges data ("0" or "1") written in the memory cell 52 by comparing the Vs with the Vref.

According to the present exemplary embodiment, where antiferromagnetic layers are not used and diffusion of materials, e.g. Mn, of antiferromagnetic layers at high-temperature processing during a process is not caused, reduction in heat resistance is less caused. In addition, a magnetization direction of a pinned layer can be set to a desired direction and a leakage magnetic field from an end of a pinned layer, which causes characteristic variation, can be prevented. Consequently, variation in magnetic characteristics becomes small and magnetic storage devices 10 with a good yield are possible.

Second Exemplary Embodiment

A magnetic unit and a magnetic storage device according to the second exemplary embodiment of the present invention will be described with reference to the attached drawings. The sectional view and the plan view in FIGS. 3 and 4 showing a primary part of a configuration of the magnetic unit according to the second exemplary embodiment, which are the same as the case of the first exemplary embodiment, are not described.

Next, the magnetic unit and the magnetic storage device according to the second exemplary embodiment of the present invention will be described in detail.

Figure 8:
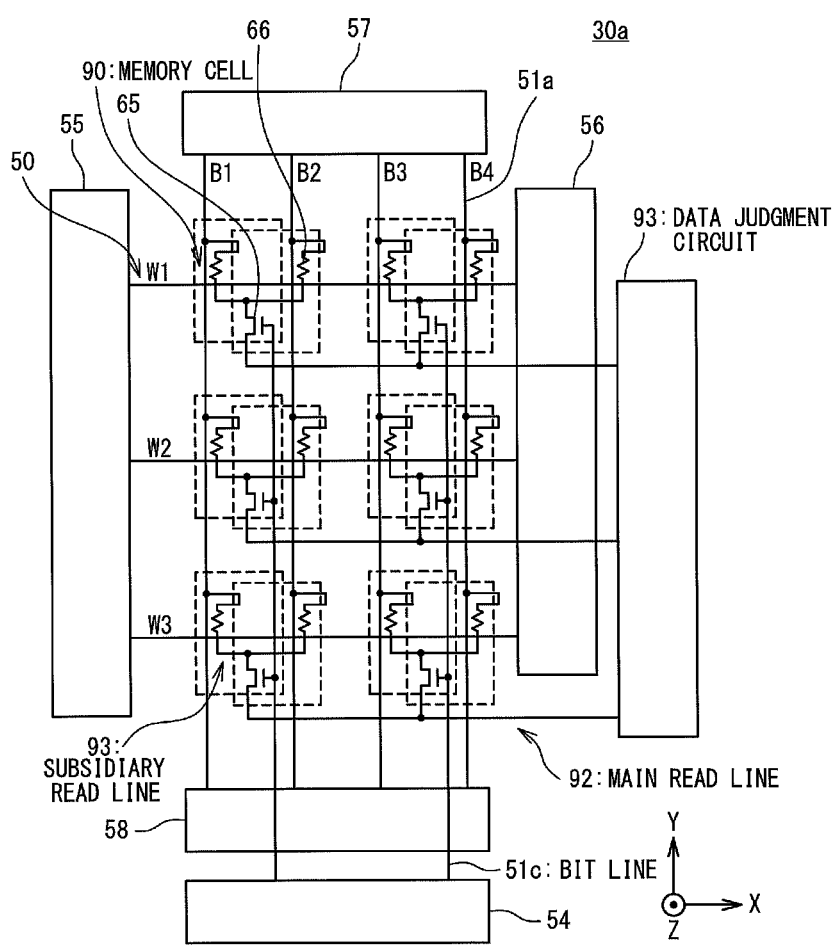
FIG. 8 is a schematic circuit block diagram showing a configuration of a magnetic storage device to which the magnetic unit is applied according to the second and third exemplary embodiments of the present invention.
Figure 9:
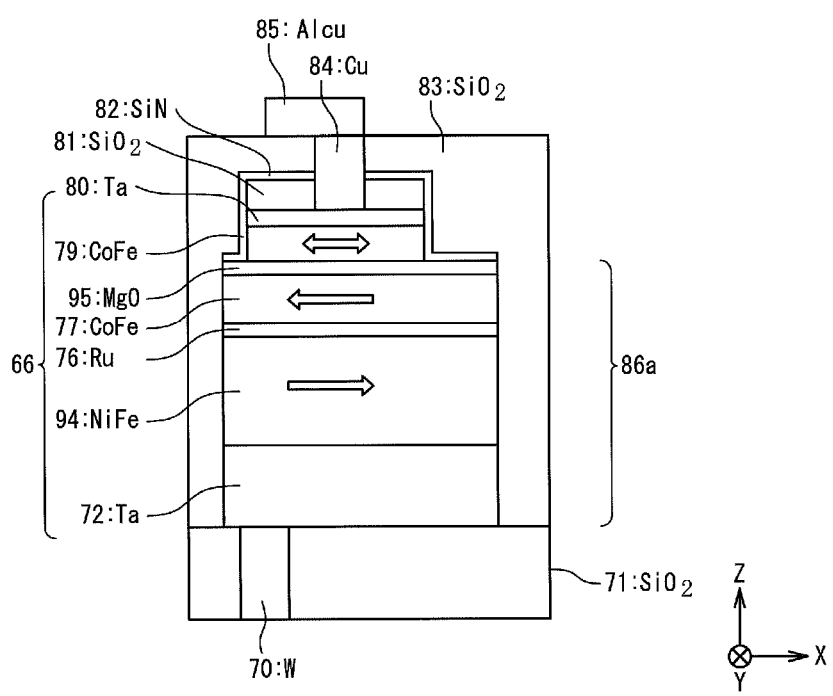
FIG. 9 is a sectional view showing a configuration of a primary part of a magnetoresistive storage element as the magnetic unit according to the second exemplary embodiment of the present invention.
Figure 10:
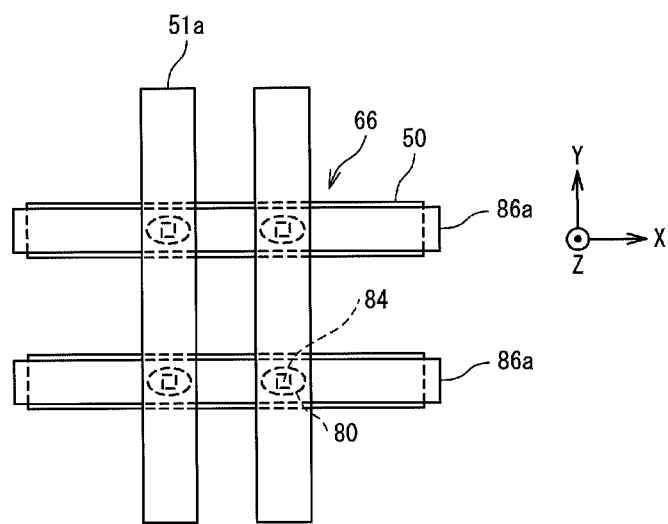
FIG. 10 is a plan view showing a configuration of a main part of a memory array of the magnetic storage device to which the magnetic unit is applied according to the second exemplary embodiment of the present invention.

FIG. 8 is a schematic circuit block diagram showing a configuration of the magnetic storage device to which the magnetic unit is applied, according to the second exemplary embodiment of the present invention. FIG. 9 is a sectional view showing a primary part of a configuration of a magnetoresistive storage element as a magnetic unit according to the second exemplary embodiment of the present invention. FIG. 10 is a plan view of a main part of a memory array of the magnetic storage device to which the magnetic unit is applied according to the second exemplary embodiment of the present invention.

First, a circuit configuration is described with reference to FIG. 8. A magnetic storage device 30a is a magnetic random-access memory. The magnetic storage device 30a includes a plurality of word lines 50, a plurality of subsidiary read lines 91, a plurality of main read lines 92, a plurality of bit lines 51a, a plurality of bit lines 51c, a plurality of memory cells 90, a read control circuit 54, a word-line control circuit 55, a word-line termination circuit 56, a bit-line control circuit 57, a bit-line termination circuit 58, and a data judgment circuit 93.

The plurality of word lines 50 extends in an X direction (first direction). One end and the other end of each word line 50 are connected to the word-line control circuit 55 and the word-line termination circuit 56, respectively. The plurality of bit lines 51a extends in a Y direction (second direction perpendicular to the first direction). One end and the other end of each bit line 51a are connected to the bit-line control circuit 57 and the bit-line termination circuit 58, respectively. The plurality of bit lines 51c extends in the Y direction (second direction perpendicular to the first direction). One end and the other end of each bit line 51c are connected to gates of selected transistors 65 of the memory cells 90 and the read control circuit 54, respectively. One bit line 51c is provided every plural number (the number is two in the case of the drawing) of bit lines 51a and shared by the memory cells 90 (selected transistors 65) arranged along the plural number (the number is two in the case of the drawing) of bit lines 51a. The plurality of main read lines 92 extends in the X direction. One end and the other end of each main read line 92 are connected to the data judgment circuit 93 and a drain of the selected transistor 65 of the memory cell 90, respectively. The main read line 92 is shared by the memory cells 90 arranged along the word line 50.

The plurality of memory cells 90 is provided to correspond to the intersections of the plurality of word lines 50 and the plurality of bit lines 51a. Each memory cell 90 includes a magnetoresistive storage element 66 and a selected transistor 65. Here, the magnetoresistive storage element 66 is a TMR (Tunneling Magneto Resistive) element. The magnetoresistive storage element 66 has two terminals. One terminal is connected to the bit line 51*a* and the other terminal is connected to the subsidiary read line 91. The subsidiary read line 91 is shared by a plurality of memory cells 90 (the drawing shows the case of two) arranged in the direction of the word line 50. That is to say, one subsidiary read line 91 is connected to the other terminals of a plurality of magnetoresistive storage elements 66 (the diagram shows the case of two). This subsidiary read line 91 is further connected to the source of the selected transistor 65. The drain of this selected transistor 65 is connected to one end of the main read line 92. The main read line 92 extends in the X direction, and the other end thereof is connected to the data judgment circuit 93. The gate of this selected transistor 65 is connected to the read control circuit 54 through the bit line 51*c*. This selected transistor 65 too, is shared by a plurality of memory cells 90 (the drawing shows the case of two) arranged in the direction of the word line 50 in the same way.

The read control circuit 54 selects a selected bit line 51*c* from the plurality of bit lines 51*c* at the time of read operation. The word-line control circuit 55 selects a selected word line 50 from the plurality of word lines 50 at the time of write operation. The word-line termination circuit 56 terminates the plurality of word lines 50 at the time of write operation. The bit-line control circuit 57 selects a selected bit line 51*a* from the plurality of bit lines 51*a*. The bit-line termination circuit 58 terminates the plurality of bit lines 51*a* at the time of write operation. The data judgment circuit 93 selects a selected main read line 92 from the plurality of main read lines 92 at the time of read operation. Data judgment is then performed based on the magnitude of a read current flowing through the selected main read line 92.

Next, a configuration of the magnetoresistive storage element 66 will be described with reference to FIG. 9.

The magnetoresistive storage element 66, which is a TMR (Tunneling Magneto Resistive) element, includes a Ta film 72 as a lower electrode, a NiFe film 94 as a magnetic substance 2, a Ru film 76 as an antiferromagnetic-coupling nonmagnetic conductor 3, a CoFe film 77 as the magnetic substance 2, a MgO film 95 as a tunnel insulating layer, a NiFe film 79 as a free layer, and a Ta film 80 as an upper electrode. Here, the Ta film 72 corresponds to a function body 5. The NiFe film 94, the Ru film 76, and the CoFe film 77 correspond to a pinned layer 20. The MgO film 95, the NiFe film 79, and the Ta film 80 correspond to a function body 4.

The Ta film 72, which is the lower electrode, is connected to a semiconductor substrate (not shown) provided with transistors including the selected transistor 65 and wiring lines including the plurality of word lines 50, through a W via 70. The Ta film 80, which is the upper electrode, is connected to an AlCu wiring line 85 as the bit line 51*a*, through a Cu via 84. The lower structure (the NiFe film 94, the Ru film 76, the CoFe film 77, and the MgO film 95) of the magnetoresistive storage element 60 is also referred to as a BASE 86*a*. The BASE 86*a*, which is the pinned layer 20 when excluding the MgO film 95, can be integrated if no trouble is caused to write operation and read operation since the magnetization directions are pinned in common in all the memory cells 90. In the case of the present exemplary embodiment, the BASE 86*a* may be shared by the memory cells 90 sharing the subsidiary read line 91, for example.

Next, a manufacturing method of the magnetoresistive storage element 66 will be described with reference to FIG. 9.

A $SiO_2$ film 71 as an interlayer insulating film is formed with the film thickness of 300 nm on a semiconductor substrate (not shown) provided with transistors including the selected transistor 65 and wiring lines including the plurality of word lines 50. The W via 70 is formed at a predetermined position of the $SiO_2$ film 71. After that, the Ta film 72 with the film thickness of 20 nm, a Ta film with the film thickness of 8 nm (not shown), the NiFe film 94 with the film thickness of 4.7 nm, the Ru film 76 with the film thickness of 0.8 nm, the CoFe film 77 with the film thickness of 2 nm, the MgO film 95 with the film thickness of 1.5 nm, the NiFe film 79 with the film thickness of 4 nm, the Ta film 80 with the film thickness of 30 nm, and a $SiO_2$ film 81 with the film thickness of 70 nm are formed using the sputtering method.

Here, in the NiFe film 94, which is the lowermost layer of the pinned layer 20, a portion of approximately 1 nm from the interface does not work as a magnetic substance due to the reaction between the Ta film 72 and the NiFe film 94. The Ru film 76 has a thickness with which the NiFe film 94 and the CoFe film 77 are antiferromagnetically coupled. The thicknesses of the NiFe film 94 and the CoFe film 77 are set such that magnetization amounts of the both are equal. The magnetization amounts of the materials used here are; Nife: 800 $emu/cm^3$ and CoFe: 1480 $emu/cm^3$. Consequently, the NiFe film 94 and the CoFe film 77 are magnetized in the opposite directions from each other and magnetization amounts of the both are equal, causing almost no leakage field to the outside.

Next, resist is formed on the TMR shape by using the photolithographic technique, the $SiO_2$ film 81 without being covered with the resist is processed by using the RIE technique, and then, the resist is removed by using the ashing technique. Next, the Ta film 80 and the NiFe film 79 are removed by using the milling technique with the pattern of the $SiO_2$ film 81 as a mask. After that, the SiN film 82 as a protective film is formed to the whole surface, resist is formed on the shape of the BASE 86*a* thereafter, and then, the SiN film 82, the MgO film 95, the CoFe film 77, the Ru film 76, the NiFe film 94, and the Ta film 72 are processed.

With the above processes, the magnetoresistive storage element 66 can be formed.

After that, as shown in FIG. 10, the BASE 86*a*, which includes the configuration as the pinned layer 20 of the CoFe film 77/Ru film 76/NiFe film 94, is a rectangle that is long in the extension direction of the word lines 50 (X direction), over a plurality of magnetoresistive storage elements 66 (memory cells 90) adjacent to each other in the X direction. The NiFe film 79 as a free layer, which is formed on the BASE 86*a*, is an ellipse that is long in the extension direction of the word lines 50 (X direction). Note that in FIG. 10, the selected transistors 65 and the bit lines 51*c* are not shown.

After that, the $SiO_2$ film 83 as an interlayer insulating film is formed on the whole surface by using the plasma CVD method. The whole surface is planarized thereafter by using the CMP technique. A via hole penetrating the $SiO_2$ film 83, the SiN film 82, and the $SiO_2$ film 81 on the free layer (the NiFe film 79) is then formed by using the photolithographic technique and the dry etching technique, to form a Cu via 84. After that, a Ti film (30 nm), an AlCu film (500 nm), and a TiN film (30 nm) are laminated, which are processed by using the photolithographic technique and the dry etching technique, to form the AlCu wiring lines 85 as the bit lines 51*a*.

Next, a magnetic field of approximately 1000 to 10000 Oe is applied to a direction of a long side of the pattern of the BASE 86*a*. Consequently, the two magnetization directions of the NiFe film 94 and the CoFe film 77 of the pinned layer 20 are directed toward a direction along the magnetic field. When the magnetic field is turned back to zero, the magnetization directions of the CoFe film 77 and the NiFe film 94, which are antiferromagnetically coupled, become opposite to each other. The pinned layer 20, which is a rectangle, has an easy axis formed in a direction of a long side, due to shape anisotropy. Additionally, the magnetization amounts of the NiFe film 94 and the CoFe film 77 are equal but anisotropic magnetic fields thereof are different, making it possible to set a magnetization direction of the pinned layer 20 to a desired direction.

Next, an operation method of the magnetoresistive storage element 66 will be described with reference to FIG. 8. First, a write method will be described.

The bit-line control circuit 57 selects a selected bit line 51a from the plurality of bit lines 51a. The word-line control circuit 55 selects a selected word line 50 from the plurality of word lines 50. By the current flowing through the selected bit line 51a and the selected word line 50, a combined magnetic field can be applied to the magnetoresistive storage element 66 of the memory cell 90 (selected cell) at a position where the selected bit line 51a and the selected word line 50 intersect. A magnetization switching current of the magnetoresistive storage element 66 varies depending on the magnitude of the magnetic field of the word line 50. For this reason, the magnetization is not switched in a cell where the current of the word line 50 does not flow, while in a cell where the current of the word line 50 flows, data can be written in only one cell by further setting the current of the bit line 51a so as to cause magnetization switching. A magnetization direction can be set with a direction of the current of the bit line 51a. Although a magnetic field is also applied to the pinned layer 20 at this time, a magnetization state does not change since the subsidiary read line 91 has long and great shape anisotropy.

Next, a read method will be described.

The read control circuit 54 selects a selected bit line 51c from the plurality of bit lines 51c. Consequently, the selected transistor 65 of the memory cell 90 (selected cell) for read is turned to the on-state. The bit-line control circuit 57 selects a selected bit line 51a that corresponds to the selected bit line 51c, from the plurality of bit lines 51a. At this time, the bit-line termination circuit 58 is turned to the open state. The data judgment circuit 93 selects a selected main read line 92 from the plurality of main read lines 92. The bit-line control circuit 57 applies 0.4 V as a read voltage to the selected bit line 51a. The data judgment circuit 93 turns the selected main read line 92 to 0 V. Consequently, a read current flows through a path from the selected bit line 51a, the magnetoresistive storage element 66, the selected transistor 65, to the selected main read line 92. The magnitude of the read current varies depending on a resistance value (a value of stored data) of the magnetoresistive storage element 66 of the memory cell 90 for read. The data judgment circuit 93 judges data ("0" or "1") that corresponds to this current value.

Here, the bit lines 51a of the memory cells 90 connected to the same subsidiary read line 91 are grounded or open. A read current flows through both the data judgment circuit 93, and also flows through the bit lines 51a connected through the memory cells 90 connected to the same subsidiary read line 91. For this reason, it is preferable that parallel resistance of a plurality of magnetoresistive storage elements 66 connected to the subsidiary read line 91 should be greater than resistance of the selected transistor 65, in order to obtain a greater read current. For example, a resistance value of the magnetoresistive storage element 66 is 20 kΩ, the number of the magnetoresistive storage elements 66 (the number of the memory cells 90) connected to the subsidiary read line 91 is eight (8), and resistance of the selected transistor 65 is approximately 1 kΩ.

Figure 11:
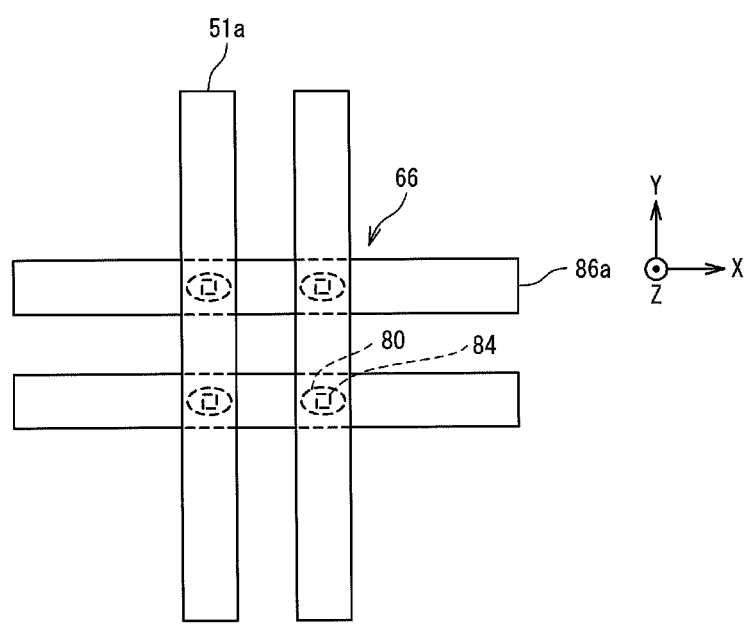
FIG. 11 is a plan view showing a configuration of a main part of a memory array of the magnetic storage device to which the magnetic unit is applied according to an application example of the second exemplary embodiment of the present invention.

In the present exemplary embodiment, it is possible to use the BASE 86a as the word line 50 without providing the word line 50 as shown in FIG. 11. FIG. 11 is a plan view showing a configuration of a main part of a memory array of the magnetic storage device to which the magnetic unit is applied according to an application example of the second exemplary embodiment of the present invention. In this case, the word line 50 is removed and the BASE 86a is extended in the X direction, where one end and the other end of the BASE 86a are connected to the word-line control circuit 55 and the word-line termination circuit 56, respectively. Consequently, in the write operation, it is possible to write the memory cell 90 with a write current through the selected BASE 86a, which corresponds to the selected word line 50, and the selected bit line 51a. The read operation can be performed in the same way as the above.

According to the present exemplary embodiment, the same effect as the first exemplary embodiment can be obtained. In addition, strong shape anisotropy can be obtained since the shape of the BASE is long. Consequently, the magnetization state of the BASE is less likely to be changed due to write magnetic fields and disturbance magnetic fields. Furthermore, further miniaturization is possible since the BASE does not need to be divided for each cell. As a result, variation in magnetic characteristics becomes small and magnetic storage devices with a good yield are possible even after miniaturization.

Third Exemplary Embodiment

A magnetic unit and a magnetic storage device according to the third exemplary embodiment of the present invention will be described with reference to the attached drawings. The sectional view and the plan view in FIG. 3 and FIG. 4 showing a configuration of a primary part of the magnetic unit according to the third exemplary embodiment, which are the same as the case of the first exemplary embodiment, are not described.

Next, the magnetic unit and the magnetic storage device according to the third exemplary embodiment of the present invention will be described in detail. FIG. 8 is a schematic circuit block diagram showing a configuration of the magnetic storage device to which the magnetic unit is applied, according to the third exemplary embodiment of the present invention. This configuration, which is the same as the case of the second exemplary embodiment, is not described.

Figure 12A:
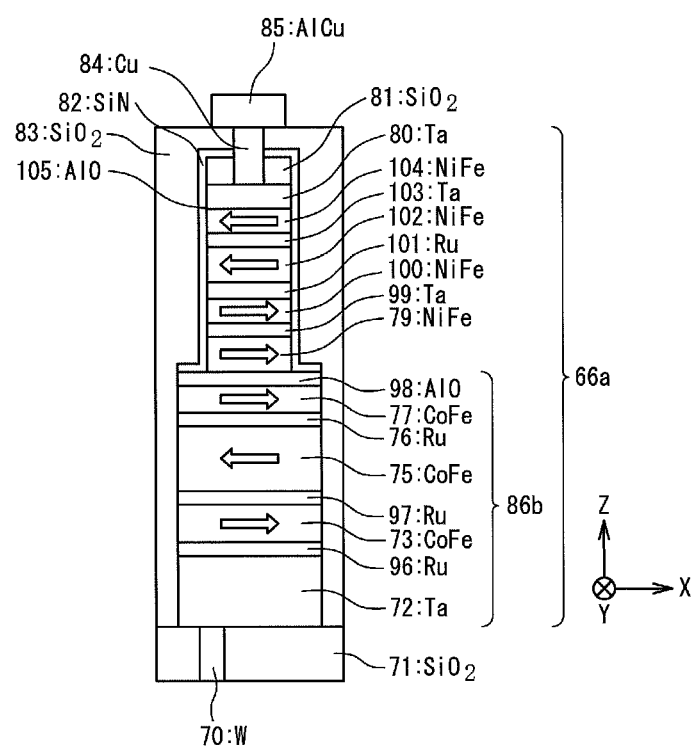
FIG. 12A is a sectional view showing a configuration of a primary part of a magnetoresistive storage element as the magnetic unit according to the third and fourth exemplary embodiments of the present invention.
Figure 12B:
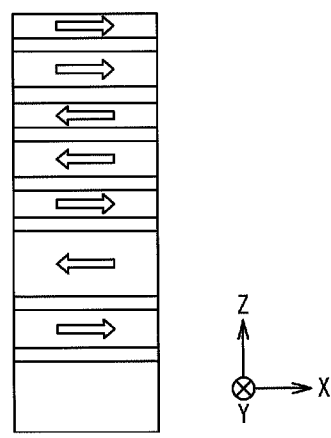
FIG. 12B is a sectional view showing the configuration of the primary part of the magnetoresistive storage element as the magnetic unit according to the third and fourth exemplary embodiments of the present invention.
Figure 13:
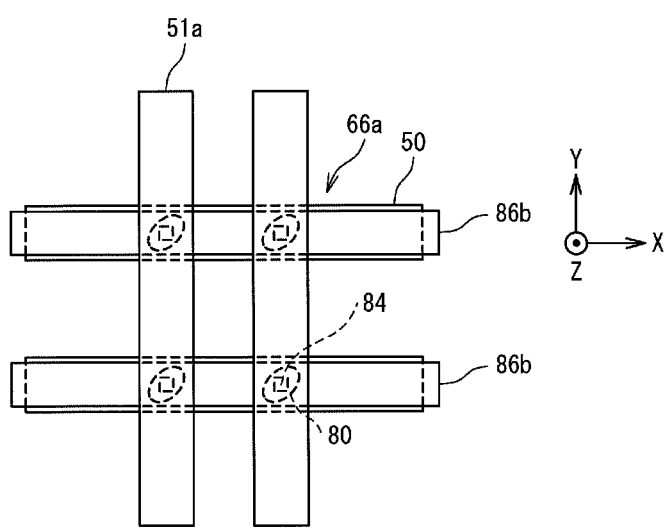
FIG. 13 is a plan view showing a configuration of a main part of a memory array of the magnetic storage device to which the magnetic unit is applied according to the third exemplary embodiment of the present invention.

FIG. 12A and FIG. 12B are sectional views showing a configuration of a primary part of a magnetoresistive storage element as a magnetic unit according to the third exemplary embodiment of the present invention. FIG. 13 is a plan view showing a configuration of a main part of a memory array of the magnetic storage device to which the magnetic unit is applied according to the third exemplary embodiment of the present invention.

Next, a configuration of a magnetoresistive storage element 66a will be described with reference to FIG. 12A and FIG. 12B. FIG. 12A shows the case where data "1" is stored while FIG. 12B shows the case where data "0" is stored, for example.

The magnetoresistive storage element 66a, which is a Tunneling Magneto Resistive (TMR) element, has a Ta film 72 as a lower electrode, a Ru film 96, a CoFe film 73 as a magnetic substance 2, a Ru film 97 as an antiferromagnetic-coupling nonmagnetic conductor 3, a CoFe film 75 as the magnetic substance 2, a Ru film 76 as the antiferromagnetic-coupling nonmagnetic conductor 3, a CoFe film 77 as the magnetic substance 2, an AlO film 98 as a tunnel insulating film, a NiFe film 79, a Ta film 99, a NiFe film 100, a Ru film 101, a NiFe film 102, a Ta film 103, a NiFe film 104, and an AlO film 105 as a free layer, and a Ta film 80 as an upper electrode. Here, the Ta film 72 and the Ru film 96 correspond to a function body 5. The CoFe film 73, the Ru film 97, the CoFe film 75, the Ru film 76, and the CoFe film 77 correspond to a pinned layer 20. The AlO film 98, the NiFe film 79, the Ta film 99, the NiFe film 100, the Ru film 101, the NiFe film 102, the Ta film 103, the NiFe film 104, the AlO film 105, and the Ta film 80 correspond to a function body 4.

The Ta film 72, which is a lower electrode, is connected to a semiconductor substrate (not shown) provided with transistors including a selected transistor 65 and wiring lines including a plurality of word lines 50, through a W via 70. The Ta film 80, which is an upper electrode, is connected to an AlCu wiring line 85 as a bit line 51a, through a Cu via 84. Note that the lower structure (the CoFe film 73, the Ru film 97, the CoFe film 75, the Ru film 76, the CoFe film 77, and the AlO film 98) of the magnetoresistive storage element 60 is also referred to as a BASE 86b. The BASE 86b, which is the pinned layer 20 when excluding the AlO film 98, can be integrated if no trouble is caused to write operation and read operation since the magnetization direction is pinned in common in all the memory cells 90. In the case of the present exemplary embodiment, the BASE 86b may be shared by the memory cells 90 that share an subsidiary read line 91, for example.

Next, a manufacturing method of the magnetoresistive storage element 66a will be described with reference to FIG. 12A and FIG. 12B.

First, the $SiO_2$ film 71 as an interlayer insulating film is formed with the film thickness of 300 nm on a semiconductor substrate (not shown) provided with transistors including the selected transistor 65 and wiring lines including the word lines 50. The W via 70 is formed at a predetermined position of the $SiO_2$ film 71. After that, the Ta film 72 with the film thickness of 20 nm, the Ru film 96 with the film thickness of 1 nm, the CoFe film 73 with the film thickness 1.4 nm, the Ru film 97 with the film thickness of 0.9 nm, the CoFe film 75 with the film thickness of 2.6 nm, the Ru film 76 with the film thickness of 0.9 nm, the CoFe film 77 with the film thickness of 1.2 nm, the AlO film 98 with the film thickness of 1.5 nm, the NiFe film 79 with the film thickness of 3.1 nm, the Ta film 99 with the film thickness of 0.3 nm, the NiFe film 100 with the film thickness of 3 nm, the Ru film 101 with the film thickness of 2.1 nm, the NiFe film 102 with the film thickness of 3.1 nm, the Ta film 103 with the film thickness of 0.3 nm, the NiFe film 104 with the film thickness of 3 nm, the AlO film 105 with the film thickness of 0.64 nm, the Ta film 80 with the film thickness of 30 nm, and a $SiO_2$ film 81 with the film thickness of 70 nm, are formed by using the sputtering method.

Here, the Ru films 97 and 76 have thicknesses with which the CoFe films 73, 75, and 77 are antiferromagnetically coupled with each other. Consequently, the CoFe films 73 and 77 are magnetized in one direction while the CoFe film 75 is magnetized in the opposite direction. By setting thicknesses such that the total magnetization amount of the CoFe films 73 and 77 and the magnetization amount of the CoFe film 75 are equal, almost no leakage field to the outside is caused.

Next, resist is formed on the TMR shape by using the photolithographic technique, the $SiO_2$ film 81 without being covered with the resist is processed by using the reactive ion etching (RIE) technique, and then, the resist is remove by using the ashing technique. Next, the Ta film 80 to the NiFe film 79 are removed by using the milling technique with the pattern of the $SiO_2$ film 81 as a mask. After that, a SiN film 82 as a protective film is formed on the whole surface, resist is formed on the shape of the BASE 86b thereafter, and then, the SiN film 82, the AlO film 98, the CoFe film 77, the Ru film 76, the CoFe film 75, the Ru film 97, the CoFe film 73, the Ru film 96, and the Ta film 72 are processed.

With the above processes, the magnetoresistive storage element 66a can be formed.

After that, as shown in FIG. 13, the BASE 86b, which includes the configuration as the pinned layer 20 of the CoFe film 77/Ru film 76/CoFe film 75/Ru film 97/CoFe film 73, is a rectangle that is long in the extension direction (X direction) of the word lines 50, over a plurality of magnetoresistive storage elements 66a (memory cells 90) adjacent to each other in the X direction. The NiFe film 79 to the NiFe film 104 as a toggle-operating free layer, which is formed on the BASE 86b, is an ellipse that is long in a direction inclined at 45 degrees with respect to the extension direction (X direction) of the word lines 50. Note that in FIG. 13, the selected transistor 65 and a bit line 51c are not shown.

After that, a $SiO_2$ film 83 as an interlayer insulating film is formed on the whole surface by using the plasma CVD method. The whole surface is planarized by using the CMP technique thereafter. Next, a via hole penetrating the $SiO_2$ film 83, the SiN film 82, and the $SiO_2$ film 81 on the free layer is formed by using the photolithographic technique and the dry etching technique, to form the Cu via 84. After that, a Ti film (30 nm), an AlCu film (50 nm), and a TiN film (30 nm) are laminated, which are processed by using the photolithographic technique and the dry etching technique, and the AlCu wiring lines 85 as the bit lines 51a are formed.

Next, a magnetic field of approximately 1000 to 10000 Oe is applied to a direction of a long side of the pattern of the BASE 86b. Consequently, the magnetization directions of the three CoFe films 73, 75, and 77 of the pinned layer 20 are directed toward a direction along the magnetic field. When the magnetic field is turned back to zero, the magnetization directions of the CoFe film 75 and the two CoFe films 77 and 73, which are antiferromagnetically coupled, become opposite to each other. The pinned layer 20, which is a rectangle, has an easy axis formed in a direction of a long side, due to shape anisotropy. Although the total magnetization amount of the CoFe films 77 and 73 and the magnetization amount of the CoFe film 75 are equal, the CoFe film 77 and 73, which are divided into two layers, has a smaller anisotropic magnetic field. Therefore, the CoFe film 75 is stable when being directed toward a directional axis of a long side nearer to a direction of an applied magnetic field and the CoFe films 77 and 73 are stable when being directed toward the opposite direction. Consequently, the magnetization direction of the pinned layer 20 can be set in a desired direction.

Next, an operation method of the magnetoresistive storage element 66 will be described with reference to FIG. 8. A read method, which is the same as the case of the second exemplary embodiment, is not described. Next, a write method will be described.

The bit-line control circuit 57 selects a selected bit line 51a from the plurality of bit lines 51a. The word-line control circuit 55 selects a selected word line 50 from the plurality of word lines 50. The bit-line control circuit 57 then applies 5 mA of a write current (bit-line current) to the selected bit line 51a. After that, the word-line control circuit 55 flows 5 mA of a write current (word-line current) through the selected word line 50. The bit-line control circuit 57 then stops the bit-line current. After that, the word-line control circuit 55 stops the word-line current. With this process, the write process is performed (toggle write) by turning a magnetization direction of a free layer in the magnetoresistive storage element 66a of the memory cell 90 (selected cell) at a position where the selected bit line 51a and the selected word line 50 intersect. Only one of a word-line current and a bit-line current is applied to the memory cells 90 (unselected cells) where the write process is not performed. For this reason, the toggle operation does not occur at the magnetoresistive storage elements 66a of unselected cells and the magnetization states of the magnetoresistive storage elements 66a do not change. Since magnetization directions change each time when the write operation is performed in toggle write, the present state should be read before the write operation, and the write operation is performed only when data are different.

In the structure of the present exemplary embodiment, an experimental result of making and evaluating an array of two cells by four cells will be shown. A free layer is an ellipse of 0.32 by 0.80 μm. With the conventional structure of (NiFe film (3 nm)/Ta film (0.3 nm)/NiFe film (3 nm)/Ru film (2.1 nm)/NiFe film (3 nm)/Ta film (0.3 nm)/NiFe film (3.1 nm)/AlO film (0.86 nm)/CoFe film (2.6 nm)/Ru film (0.9 nm)/CoFe film (2.8 nm)/PtMn film (20 nm)/NiFe film (1 nm)/Ta film (5 nm)), variation in bit-line currents was 7.6% and variation in word-line currents was 9.2%. With the configuration of the present exemplary embodiment however, variation in bit-line currents and variation in word-line currents were improved to 7.4% and 6.6% respectively.

Figure 14:
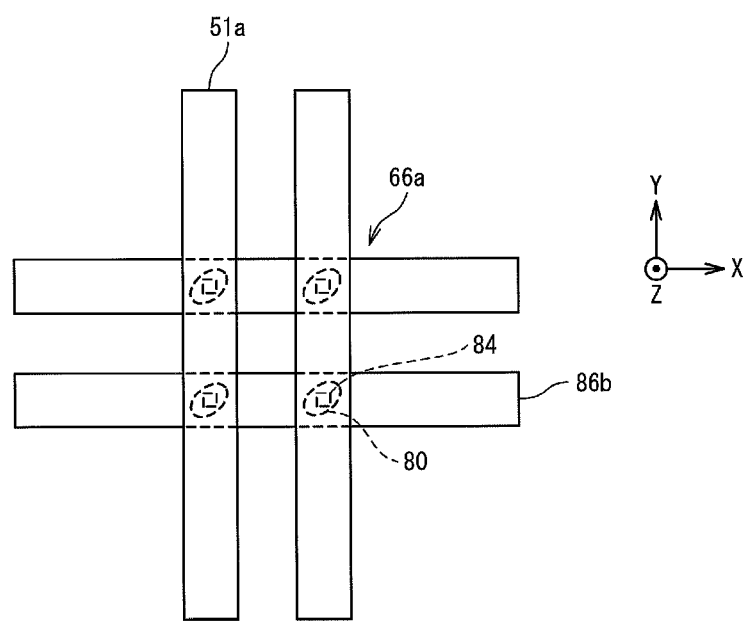
FIG. 14 is a plan view showing a configuration of a main part of a memory array of the magnetic storage device to which the magnetic unit is applied according to an application example of the third exemplary embodiment of the present invention.

In the present exemplary embodiment, as shown in FIG. 14, it is possible to use the BASE 86b as the word line 50 without providing the word line 50. FIG. 14 is a plan view showing a configuration of a main part of a memory array of the magnetic storage device to which the magnetic unit is applied according to an application example of the third exemplary embodiment of the present invention. In this case, the word line 50 is removed and the BASE 86b is extended in the X direction, where one end and the other end of the BASE 86b are connected to the word-line control circuit 55 and the word-line termination circuit 56, respectively. Consequently, in the write operation, it is possible to write the memory cell 90 with the toggle operation using a write current flowing thorough the selected BASE 86b which corresponds to the selected word line 50, and the selected bit line 51a. The read operation can be performed in the same way as the above.

Figure 15:
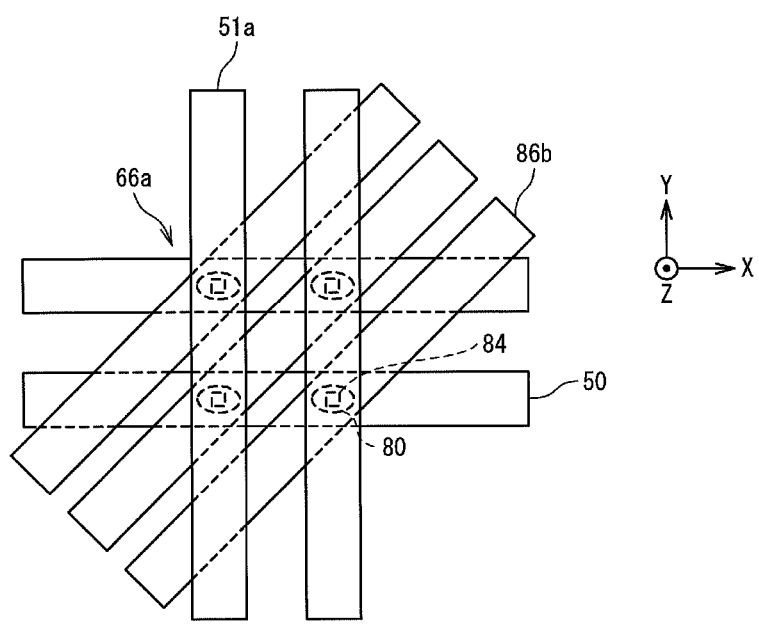
FIG. 15 is a plan view showing a configuration of a main part of a memory array of the magnetic storage device to which the magnetic unit is applied according to another application example of the third exemplary embodiment of the present invention.

In the present exemplary embodiment, as shown in FIG. 15, a layout in which the extension direction of the BASE 86b is shifted by 45 degrees with respect to the extension directions of the word lines 50 or the bit lines 51a, is also possible. FIG. 15 is a plan view showing a configuration of a main part of a memory array of the magnetic storage device to which the magnetic unit is applied according to another application example of the third exemplary embodiment of the present invention. In this case, a direction of a major axis of an ellipse of a free layer and an extension direction of the BASE 86b are parallel to each other.

In the present exemplary embodiment, application of the present technique is also possible to toggle-operating TMR elements and the same effect as the first and second exemplary embodiments can be obtained. As a result, variation in magnetic characteristics becomes small and magnetic storage devices with a good yield are possible.

Fourth Exemplary Embodiment

A magnetic unit and a magnetic storage device according to the fourth exemplary embodiment of the present invention will be described with reference to the attached drawings. The sectional view and the plan view in FIG. 3 and FIG. 4 showing a configuration of a primary part of the magnetic unit according to the fourth exemplary embodiment, which are the same as the case of the first exemplary embodiment, are not described.

Next, the magnetic unit and the magnetic storage device according to the fourth exemplary embodiment of the present invention will be described in detail.

Figure 16:
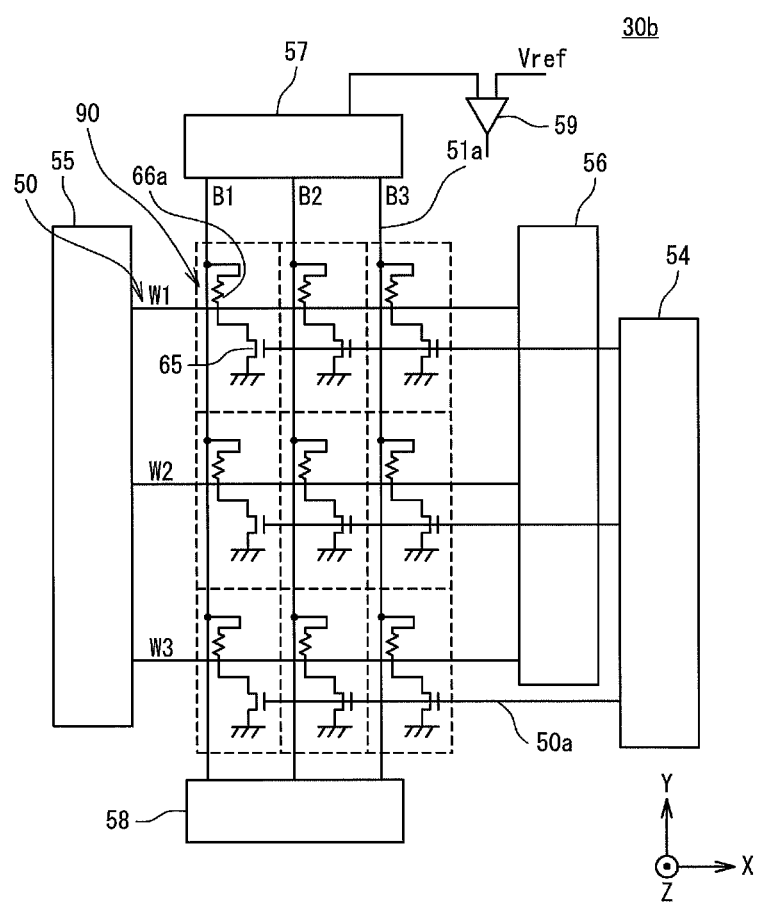
FIG. 16 is a schematic circuit block diagram showing a configuration of a magnetic storage device to which the magnetic unit is applied according to the fourth exemplary embodiment of the present invention.
Figure 17:
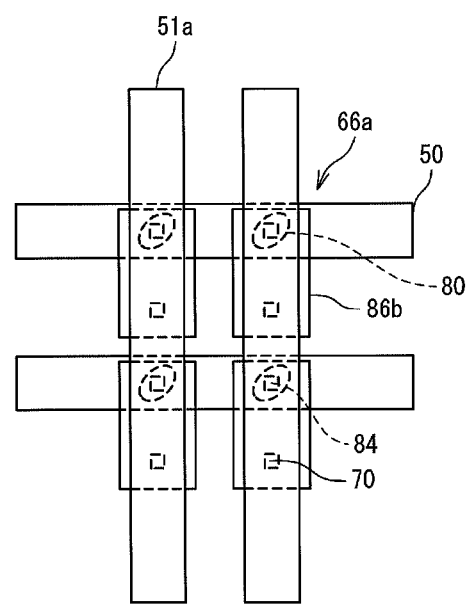
FIG. 17 is a plan view showing a configuration of a main part of a memory array of the magnetic storage device to which the magnetic unit is applied according to the fourth exemplary embodiment of the present invention.

FIG. 16 is a schematic circuit block diagram showing a configuration of the magnetic storage device to which the magnetic unit is applied, according to the fourth exemplary embodiment of the present invention. FIG. 12A and FIG. 12B are sectional views showing a configuration of a primary part of a magnetoresistive storage element as a magnetic unit according to the fourth exemplary embodiment of the present invention. FIG. 17 is a plan view showing a configuration of a main part of a memory array of the magnetic storage device to which the magnetic unit is applied according to the fourth exemplary embodiment of the present invention. Note that in FIG. 17, a selected transistor 65 and a word line 50a are not shown.

First, a circuit configuration will be described with reference to FIG. 16. A magnetic storage device 30b is a magnetic random-access memory. The magnetic storage device 30b includes a plurality of word lines 50, a plurality of word lines 50a, a plurality of bit lines 51a, a plurality of memory cells 90, a read control circuit 54, a word-line control circuit 55, a word-line termination circuit 56, a bit-line control circuit 57, a bit-line termination circuit 58, and a sense amplifier 59.

The plurality of word lines 50 extends in an X direction (first direction). One end and the other end of each word line 50 are connected to the word-line control circuit 55 and the word-line termination circuit 56, respectively. The plurality of word lines 50a extends in the X direction (first direction). One end and the other end of each word line 50a are connected to the gates of the selected transistors 65 of the memory cells 90 and the read control circuit 54, respectively. Each word line 50a is shared by the memory cells 90 (selected transistors 65) arranged along the extension direction (X direction). The plurality of bit lines 51a extends in a Y direction (second direction perpendicular to the first direction). One end and the other end of each bit line 51a are connected to the bit-line control circuit 57 and the bit-line termination circuit 58, respectively.

The plurality of memory cells 90 is provided to correspond to the intersections of the plurality of word lines 50 and the plurality of bit lines 51a. Each memory cell 90 includes a magnetoresistive storage element 66a and a selected transistor 65. Here, the magnetoresistive storage element 66a is a Tunneling Magneto Resistive (TMR) element. The magnetoresistive storage element 66a has two terminals. One terminal is connected to the bit line 51a while the other terminal is connected to the source of the selected transistor 65. The drain of the selected transistor 65 is grounded while the gate is connected to the read control circuit 54 through the word line 50a.

The read control circuit 54 selects a selected word line 50a from the plurality of word lines 50a at the time of read operation. The word-line control circuit 55 selects a selected word line 50 from the plurality of word lines 50 at the time of write operation. The word-line termination circuit 56 terminates the plurality of word lines 50 at the time of write operation. The bit-line control circuit 57 selects a selected bit line 51a from the plurality of bit lines 51a. The bit-line termination circuit 58 terminates the plurality of bit lines 51a at the time of write operation. The sense amplifier 59, which is connected to the bit-line control circuit 57, compares a reference potential Vref with a bit-line potential acquired through the bit-line control circuit 57 to judge data at the time of read operation.

Next, a configuration and a manufacturing method of the magnetoresistive storage element 66a in FIG. 12A and FIG. 12B, which are the same as the case of the third exemplary embodiment, are not described. Additionally, a write method, which is the same as the case of the third exemplary embodiment, is not described.

The read control circuit 54 selects a selected word line 50a from the plurality of word lines 50a. Consequently, the selected transistor 65 of the memory cell 90 (selected cell) for read is turned to the on-state. The bit-line control circuit 57 selects a selected bit line 51a from the plurality of bit lines 51a. At this time, the bit-line termination circuit 58 is turned to the open state. When voltage is applied to the selected bit line 51a by the bit-line control circuit 57, a read current flows through a path from the selected bit line 51a, the magnetoresistive storage element 66a, the selected transistor 65, to the ground. The magnitude of the read current varies depending on a resistance value (value of stored data) of the magnetoresistive storage element 66a of the memory cell 90 for read. The bit-line control circuit 57 converts a current value of the read current into a voltage and outputs the voltage to the sense amplifier 59 as a sense voltage Vs. To the sense amplifier 59, an intermediate value of voltages (V0 and V1) outputted based on the data values ("0" and "1"), is given as the Vref. By comparing the Vref with the Vs, the sense amplifier 59 judges data ("0" or "1") written in the memory cell 52.

Figure 18:
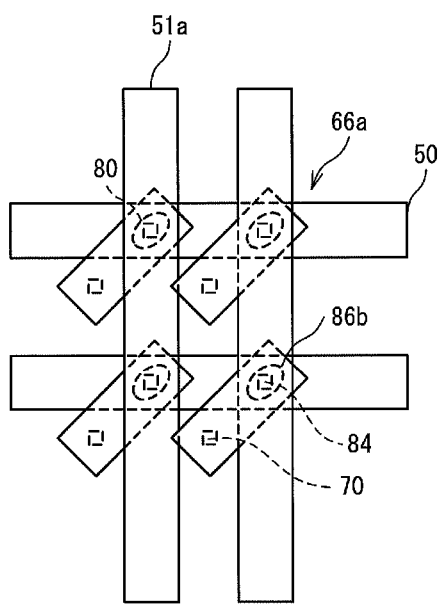
FIG. 18 is a plan view showing a configuration of a main part of a memory array of the magnetic storage device to which the magnetic unit is applied according to an application example of the fourth exemplary embodiment of the present invention.

In the present exemplary embodiment, a layout in which the extension direction of the BASE 86b is shifted by 45 degrees with respect to the extension directions of the word lines 50 or the bit lines 51a, is also possible as shown in FIG. 18. FIG. 18 is a plan view showing a configuration of a main part of a memory array of the magnetic storage device to which the magnetic unit is applied according to an application example of the fourth exemplary embodiment of the present invention. In this case, a direction of a major axis of an ellipse of a free layer and the extension direction of the BASE 86b are parallel to each other.

Although the present exemplary embodiment shows the case where three layers or below of magnetic substance layers are included in a pinned layer, a configuration that includes four layers or above is also possible. The respective magnetic substance layers are antiferromagnetically or ferromagnetically coupled through nonmagnetic conductive layers put between the magnetic substance layers, where it is free to decide which layers are antiferromagnetically and ferromagnetically coupled without departing from the technical idea of the present invention.

It is possible to provide another function body instead of an conductor or an insulator. Data write can also be performed with a method in which spin electrons are injected by current flowing between a free layer and a pinned layer. A magnetization direction of a free layer can be set with a direction of the current. Alternatively, it is possible to use a write method in which a magnetization state is set with a method in which a magnetic domain wall is provided to a free layer and current flows in a plane direction of the free layer in order to move the magnetic domain wall.

It is apparent that the present invention is not limited to the above exemplary embodiments, but may be appropriately changed without departing from the scope of the technical idea of the invention. Additionally, the exemplary embodiments can be combined with each other, provided that technical contradictions are not caused with each other.

According to the present invention as described above, magnetic units with excellent resistance properties to high-temperature treatment and small characteristic variation can be obtained and hence magnetic units with a good yield can be provided. The magnetic unit of the present invention, which does not use antiferromagnetic layers containing diffusible materials, is less likely to cause characteristic degradation even when high-temperature treatment is performed. Therefore, the effect that characteristic variation is reduced, can be obtained.

According to the present invention, it is possible to provide a magnetic unit and a magnetic storage device which can prevent characteristic degradation caused by material diffusion even when high-temperature treatment is performed and which have small characteristic variation. A manufacturing yield can be improved and manufacturing costs can be reduced.

Although the present invention is mentioned above together with the exemplary embodiments, it is obvious to those skilled in the art that the exemplary embodiments are merely presented to describe the present invention, where the exemplary embodiments must not be depended upon to interpret the attached claims so that the meaning is limited.

What is claimed is:

1. A magnetic unit comprising:
   a magnetic pinned layer configured to be provided that a magnetization direction of the magnetic pinned layer is pinned;
   a first function body configured to be provided in contact with a first side of the magnetic pinned layer and perform a function with the magnetic pinned layer; and
   a second function body configured to be provided in contact with a second side opposite to the first side of the magnetic pinned layer,
   wherein the second function body is any of a nonmagnetic conductor, a nonmagnetic insulator, and a function body which performs a function with the magnetic pinned layer,
   wherein the magnetic pinned layer includes:
   a plurality of magnetic substance layers, the plurality of magnetic substance layers having a top side as to the plurality as a whole and having a bottom side as to the plurality as a whole, and
   at least one nonmagnetic conductive layer configured to be provided between the plurality of magnetic substance layers,
   wherein the at least one nonmagnetic conductive layer ferromagnetically or antiferromagnetically couples the magnetic substance layers on both the top and the bottom sides of the plurality of magnetic substance layers,
   wherein at least one of the at least one nonmagnetic conductive layer antiferromagnetically couples the magnetic substance layers on both the top and the bottom sides of the plurality of magnetic substance layers,
   wherein a total amount of magnetizations of the plurality of magnetic substance layers is approximately zero,
   wherein among the plurality of magnetic substance layers, a magnitude of an anisotropic magnetic field of a group of the plurality of magnetic substance layers directed toward a first direction is different from a magnitude of an anisotropic magnetic field of a different group of the plurality of magnetic substance layers directed toward a second direction opposite to the first direction,
   wherein a total amount of the anisotropic magnetic fields of the plurality of magnetic substance layers is not zero.

2. The magnetic unit according to claim 1, wherein a pattern shape of at least one of the plurality of magnetic substance layers has an aspect ratio of more than 1.

3. The magnetic unit according to claim 1, wherein the number of layers of the plurality of magnetic substance layers is at least three, and
   wherein an amount of a magnetization of a first magnetic substance layer which is the nearest to the first function body is smaller than that of a second magnetic substance layer which is the farthest to the first function body in the plurality of magnetic substance layers.

4. The magnetic unit according to claim 3, wherein the amount of the magnetization of the first magnetic substance layer is the smallest in the plurality of magnetic substance layers.

5. The magnetic unit according to claim 3, wherein a thickness of the first magnetic substance layer is thinner than that of the second magnetic substance layer.

6. The magnetic unit according to claim 5, wherein the thickness of the first magnetic substance layer is the thinnest in the plurality of the magnetic substance layers.

7. The magnetic unit according to claim 5, wherein an effective thickness workable for a magnetic substance of the first magnetic substance layer is thinner than that of the second magnetic substance layer.

8. The magnetic unit according to claim 7, wherein the effective thickness workable for a magnetic substance of the first magnetic substance layer is thinnest in the plurality of the magnetic substance layers.

9. The magnetic unit according to claim 3, wherein said plurality of magnetic substance layers includes layers made from materials different from each other.

10. The magnetic unit according to claim 9, wherein a first magnetic moment of a first magnetic substance layer material used for the first magnetic substance layer is larger than a second magnetic moment of a second magnetic substance layer material used for the second magnetic substance layer.

11. The magnetic unit according to claim 1, wherein the first function body includes:
an intermediate layer configured to be any of an insulating layer and a nonmagnetic layer, and
a free layer configured to be any of a single magnetic substance layer and a laminated magnetic layer in which a plurality of magnetic substance layers are laminated through nonmagnetic layers,
wherein a data is stored based on a relation between a magnetization direction of the magnetic pinned layer and a magnetization direction of the free layer.

12. A magnetic storage device comprising:
a plurality of word lines configured to extend in a first direction;
a plurality of bit lines configured to extend in a second direction; and
a plurality of magnetic units configured to be provided to correspond to intersections of the plurality of word lines and the plurality of bit lines, have one end connected to one of corresponding one word line of the plurality of word lines and corresponding one bit line of the plurality of bit lines,
wherein each of the plurality of magnetic units the includes:
a magnetic pinned layer configured to be provided that a magnetization direction of the magnetic pinned layer is pinned;
a first function body configured to be provided in contact with a first side of the magnetic pinned layer and perform a function with the magnetic pinned layer; and
a second function body configured to be provided in contact with a second side opposite to the first side of the magnetic pinned layer,
wherein the second function body is any of a nonmagnetic conductor, a nonmagnetic insulator, and a function body which performs a function with the magnetic pinned layer,
wherein the magnetic pinned layer includes:
a plurality of magnetic substance layers, the plurality of magnetic substance layers having as to the plurality as a whole and having a bottom side as to the plurality as a whole, and
at least one nonmagnetic conductive layer configured to be provided between the plurality of magnetic substance layers,
wherein the at least one nonmagnetic conductive layer ferromagnetically or antiferromagnetically couples the magnetic substance layers on both the top and the bottom sides of the plurality of magnetic substance layers,
wherein at least one of the at least one nonmagnetic conductive layer antiferromagnetically couples the magnetic substance layers on both the top and the bottom sides of the plurality of magnetic substance layers,
wherein a total amount of magnetizations of the plurality of magnetic substance layers is approximately zero,
wherein among the plurality of magnetic substance layers, a magnitude of an anisotropic magnetic field of a group of the plurality of magnetic substance layers directed toward a first direction is different from a magnitude of an anisotropic magnetic field of a different group of the plurality of magnetic substance layers directed toward a second direction opposite to the first direction,
wherein the first function body includes:
an intermediate layer configured to be any of an insulating layer and a nonmagnetic layer, and
a free layer configured to be any of a single magnetic substance layer and a laminated magnetic layer in which a plurality of magnetic substance layers are laminated through nonmagnetic layers,
wherein a data is stored based on a relation between a magnetization direction of the magnetic pinned layer and a magnetization direction of the free layer,
wherein a total amount of the anisotropic magnetic fields of the plurality of magnetic substance layers is not zero.

13. The magnetic storage device according to claim 12, wherein a pattern shape of at least one of the plurality of magnetic substance layers has an aspect ratio of more than 1.

14. The magnetic storage device according to claim 12, wherein the number of layers of the plurality of magnetic substance layers is at least three, and
wherein an amount of a magnetization of a first magnetic substance layer which is the nearest to the first function body is smaller than that of a second magnetic substance layer which is the farthest to the first function body in the plurality of magnetic substance layers.

15. The magnetic storage device according to claim 14, wherein the amount of the magnetization of the first magnetic substance layer is the smallest in the plurality of magnetic substance layers.

16. The magnetic storage device according to claim 14, wherein a thickness of the first magnetic substance layer is thinner than that of the second magnetic substance layer.

17. The magnetic storage device according to claim 16, wherein the thickness of the first magnetic substance layer is the thinnest in the plurality of the magnetic substance layers.

18. The magnetic storage device according to claim 16, wherein an effective thickness workable for a magnetic substance of the first magnetic substance layer is thinner than that of the second magnetic substance layer.

19. The magnetic storage device according to claim 18, wherein the effective thickness workable for a magnetic substance of the first magnetic substance layer is thinnest in the plurality of the magnetic substance layers.

20. The magnetic storage device according to claim 14, wherein said plurality of magnetic substance layers includes layers made from materials different from each other.

21. The magnetic storage device according to claim 20, wherein a first magnetic moment of a first magnetic substance layer material used for the first magnetic substance layer is larger than a second magnetic moment of a second magnetic substance layer material used for the second magnetic substance layer.

22. The magnetic storage device according to claim 12, wherein the first function body includes:
- an intermediate layer configured to be any of an insulating layer and a nonmagnetic layer, and
- a free layer configured to be any of a single magnetic substance layer and a laminated magnetic layer in which a plurality of magnetic substance layers are laminated through nonmagnetic layers,
- wherein a data is stored based on a relation between a magnetization direction of the magnetic pinned layer and a magnetization direction of the free layer.

* * * * *